(12) United States Patent
Choi et al.

(10) Patent No.: US 10,879,248 B2
(45) Date of Patent: Dec. 29, 2020

(54) SEMICONDUCTOR DEVICES INCLUDING CAPACITORS AND METHODS OF MANUFACTURING THE SAME

(71) Applicant: SAMSUNG ELECTRONICS CO., LTD., Suwon-si (KR)

(72) Inventors: Hoon-Sang Choi, Seoul (KR); Hyeok-Jin Jeong, Hwaseong-si (KR); Jung-Kun Lim, Hwaseong-si (KR); Young-Mo Tak, Hwaseong-si (KR); Sung-Kil Han, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 34 days.

(21) Appl. No.: 16/281,487

(22) Filed: Feb. 21, 2019

(65) Prior Publication Data

US 2019/0189615 A1 Jun. 20, 2019

Related U.S. Application Data

(63) Continuation of application No. 15/389,689, filed on Dec. 23, 2016, now abandoned.

(30) Foreign Application Priority Data

Dec. 24, 2015 (KR) .................. 10-2015-0185614

(51) Int. Cl.
*H01L 27/108* (2006.01)
*H01L 49/02* (2006.01)
*H01L 21/02* (2006.01)

(52) U.S. Cl.
CPC .... *H01L 27/10814* (2013.01); *H01L 21/0223* (2013.01); *H01L 27/10823* (2013.01);
(Continued)

(58) Field of Classification Search
CPC ......... H01L 27/10814; H01L 27/10823; H01L 27/10852; H01L 27/10855; H01L 28/75; H01L 28/90; H01L 28/91; H01L 21/0223; H01L 21/02255; H01L 21/823418; H01L 21/823814; H01L 29/0882–0886; H01L 29/0865–0869; H01L 29/41758; H01L 29/41783; H01L 29/4236; H01L 29/42352; H01L 29/66613–66628
(Continued)

(56) References Cited

U.S. PATENT DOCUMENTS

| 5,005,102 A | 4/1991 | Larson |
| 6,156,606 A | 12/2000 | Michaelis |

(Continued)

FOREIGN PATENT DOCUMENTS

| KR | 10-2009-0074562 A | 7/2009 |
| KR | 10-2015-0028396 A | 3/2015 |

*Primary Examiner* — Natalia A Gondarenko
(74) *Attorney, Agent, or Firm* — Lee IP Law, P.C.

(57) ABSTRACT

A semiconductor device includes a substrate, a conductive pattern on the substrate, a lower electrode electrically connected to the conductive pattern, a dielectric layer covering a surface of the lower electrode, a first upper electrode on the dielectric layer, a diffusion barrier on an upper surface of the first upper electrode, and a second upper electrode covering the diffusion barrier, the second upper electrode including a different material from that of the first upper electrode.

20 Claims, 25 Drawing Sheets

(52) U.S. Cl.
CPC .. *H01L 27/10852* (2013.01); *H01L 27/10855* (2013.01); *H01L 28/75* (2013.01); *H01L 28/90* (2013.01); *H01L 28/91* (2013.01); *H01L 21/02255* (2013.01)

(58) Field of Classification Search
USPC .............................. 257/295, 300, 310, 532
See application file for complete search history.

(56) References Cited

U.S. PATENT DOCUMENTS

| | | | |
|---|---|---|---|
| 6,380,580 B1 | 4/2002 | Arita | |
| 7,750,385 B2 | 7/2010 | Chung et al. | |
| 7,776,730 B2 | 8/2010 | Kim et al. | |
| 8,779,486 B2 | 7/2014 | Fujimori et al. | |
| 8,969,169 B1 | 3/2015 | Chen et al. | |
| 2004/0089891 A1* | 5/2004 | Anma | H01L 23/5226 257/296 |
| 2004/0222493 A1 | 11/2004 | Sato et al. | |
| 2006/0113578 A1 | 6/2006 | Chung et al. | |
| 2007/0040203 A1 | 2/2007 | Lee et al. | |
| 2007/0236863 A1 | 10/2007 | Lee et al. | |
| 2008/0048291 A1 | 2/2008 | Chung et al. | |
| 2008/0157157 A1 | 7/2008 | Tonomura et al. | |
| 2010/0155799 A1* | 6/2010 | Yokoyama | H01L 21/823418 257/296 |
| 2012/0032300 A1 | 2/2012 | Wang | |
| 2013/0052780 A1* | 2/2013 | Kim | H01L 27/10855 438/270 |
| 2015/0061074 A1 | 3/2015 | Lee et al. | |
| 2015/0279842 A1* | 10/2015 | Komeda | H01L 27/10852 257/532 |

\* cited by examiner

FIRST DIRECTION

SECOND DIRECTION

SEMICONDUCTOR DEVICES INCLUDING CAPACITORS AND METHODS OF MANUFACTURING THE SAME

CROSS-REFERENCE TO RELATED APPLICATIONS

This is a continuation application based on pending application Ser. No. 15/389,689, filed Dec. 23, 2016, the entire contents of which is hereby incorporated by reference.

Korean Patent Application No. 10-2015-0185614, filed on Dec. 24, 2015, in the Korean Intellectual Property Office, and entitled: "Semiconductor Devices Including Capacitors and Methods of Manufacturing the Same," is incorporated by reference herein in its entirety.

BACKGROUND

1. Field

Example embodiments relate to semiconductor devices including capacitors and methods of manufacturing the same.

2. Description of the Related Art

A dynamic random access memory (DRAM) device is a volatile memory device including a capacitor. As the DRAM device becomes more integrated, the number of the capacitors in a unit area may increase. Accordingly, a thickness of a layer or a pattern included in the capacitor may be reduced, and an aspect ratio of the capacitor may be increased to cause electrical and mechanical defects of the capacitor.

SUMMARY

Example embodiments provide a semiconductor device including a capacitor with improved electrical and mechanical reliability. Example embodiments also provide a method of manufacturing a semiconductor device including a capacitor with improved electrical and mechanical reliability.

According to example embodiments, there is provided a semiconductor device that may include a substrate, a conductive pattern on the substrate, a lower electrode electrically connected to the conductive pattern, a dielectric layer covering a surface of the lower electrode, a first upper electrode on the dielectric layer, a diffusion barrier formed on an upper surface of the first upper electrode, and a second upper electrode covering the diffusion barrier. The second upper electrode may include a different material from that of the first upper electrode.

According to example embodiments, there is provided a semiconductor device that may include a substrate, a lower contact on the substrate, and a capacitor electrically connected to the lower contact. The capacitor may include a lower electrode on the lower contact, a dielectric layer on a surface of the lower electrode, a first upper electrode on the dielectric layer, the first upper electrode including a metal or a metal nitride, a diffusion barrier formed from an upper surface of the first upper electrode, and a second upper electrode on the diffusion barrier, the second upper electrode including a non-metallic conductive material.

According to example embodiments, there is provided a semiconductor device that may include a plurality of active patterns, gate structures on the active patterns, conductive contacts electrically connected to upper portions of the active patterns adjacent to the gate structures, and a plurality of capacitors electrically connected to a respective one of the conductive contacts. The capacitor may include a lower electrode on one of the conductive contacts, a dielectric layer formed on a surface of the lower electrode, the dielectric layer including at least one dielectric metal oxide layer, and an upper electrode having a multi-layered structure, the multi-layered structure including a barrier layer therein, the barrier layer including a conductive metal oxide.

According to example embodiments, there is provided a method of manufacturing a semiconductor device. In the method, a lower electrode may be formed on a substrate. A dielectric layer may be formed on the lower electrode. A first upper electrode may be formed on the dielectric layer. The first upper electrode may include a metal or a metal nitride. A diffusion barrier may be formed by oxidizing a surface of the first upper electrode. A second upper electrode may be formed on the diffusion barrier. The second upper electrode may include a silicon-based compound.

According to example embodiments, there is provided a semiconductor device that may include a conductive pattern on a substrate, a lower electrode electrically connected to the conductive pattern, a dielectric layer on the lower electrode, a first upper electrode on the dielectric layer, a diffusion barrier on the first upper electrode, the first upper electrode being between the dielectric layer and the diffusion barrier, and a second upper electrode on the diffusion barrier, the diffusion barrier separating the first and second upper electrodes.

BRIEF DESCRIPTION OF THE DRAWINGS

Features will become apparent to those of ordinary skill in the art by describing in detail exemplary embodiments with reference to the attached drawings, in which.

DETAILED DESCRIPTION

FIGS. 1 to 5 are cross-sectional views illustrating a capacitor and stages in a method of forming the capacitor in accordance with example embodiments.

Figure 1:
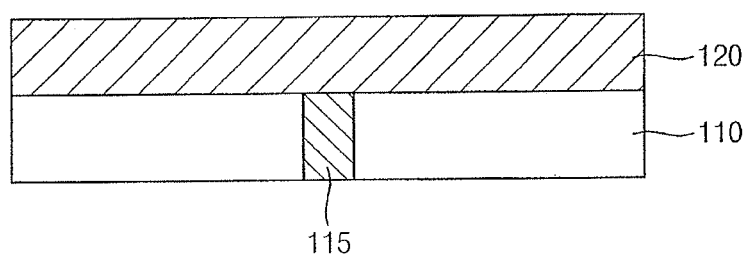
FIGS. 1 to 5 illustrate cross-sectional views of a capacitor and a method of forming the capacitor in accordance with example embodiments.

Referring to FIG. 1, a lower electrode 120 may be formed, e.g., directly, on an insulation layer 110 and a conductive pattern 115.

The insulation layer 110 may include a silicon-oxide based material, e.g., plasma enhanced oxide (PEOX), tetraethyl orthosilicate (TEOS), silicate glass, or the like.

The conductive pattern 115 may be formed in the insulation layer 100, and a top surface of the conductive pattern 115 may be exposed through a top surface of the insulation layer 110. In some embodiments, the conductive pattern 115 may have a contact shape or a plug shape extending through the insulation layer 110. For example, the conductive pattern 115 may include a metal, e.g., copper, tungsten, aluminum, etc., doped polysilicon, a metal nitride and/or a metal silicide.

In example embodiments, the lower electrode 120 may serve as a storage electrode of the capacitor. The lower electrode 120 may be formed of a metal, e.g., copper, aluminum, tungsten, platinum, rubidium, iridium, titanium, tantalum, etc., or a metal nitride, e.g., titanium nitride, tantalum nitride, tungsten nitride, etc. In some embodiments, the lower electrode 120 may be formed of titanium nitride.

For example, the lower electrode 120 may be formed by a chemical vapor deposition (CVD) process or an atomic layer deposition (ALD) process. For example, a metal precursor, e.g., titanium chloride (TiClx) or an organic titanium compound, may be introduced in a process chamber. Additionally, a reactive gas including a nitrogen-containing compound, e.g., ammonia ($NH_3$) or an alkyl amine, may be also introduced to be reacted with the metal precursor. Accordingly, the lower electrode 120 including, e.g., titanium nitride, may be formed. In another example, the lower electrode 120 may be formed by a sputtering process utilizing a metal target (e.g., a titanium target) and the reactive gas.

Figure 2:
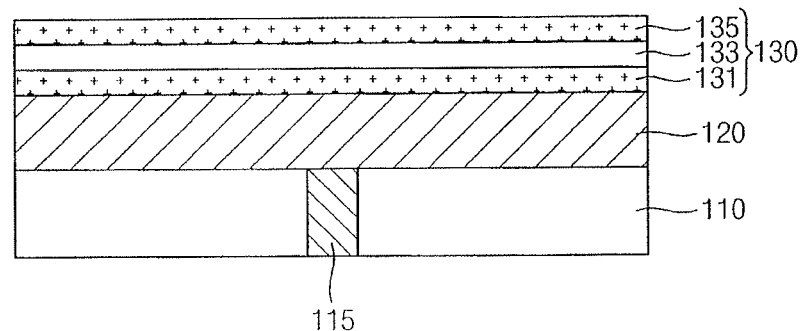

Referring to FIG. 2, a dielectric layer 130 may be formed, e.g., directly, on the lower electrode 120.

In some example embodiments, the dielectric layer 130 may be formed as a multi-layered structure. For example, as illustrated in FIG. 2, the dielectric layer 130 may include a first dielectric layer 131, a second dielectric layer 133, and a third dielectric layer 135.

The dielectric layer 130 may include silicon oxide, or a high dielectric (high-k) metal oxide, e.g., zirconium oxide, aluminum oxide, hafnium oxide, titanium oxide, tantalum oxide, etc. For example, at least one of the first dielectric layer 131, the second dielectric layer 133, or the third dielectric layer 135 may include the high-k metal oxide.

In some embodiments, each of the first dielectric layer 131, the second dielectric layer 133, and the third dielectric layer 135 may include the metal oxide. For example, the first dielectric layer 131, the second dielectric layer 133, and the third dielectric layer 135 may include zirconium oxide ($ZrO_2$), aluminum oxide ($Al_2O_3$) and zirconium oxide ($ZrO_2$), respectively.

For example, the first dielectric layer 131, the second dielectric layer 133, and the third dielectric layer 135 may be formed by an ALD process utilizing an organic metal precursor, and an oxidizing reactive gas including, e.g., oxygen, ozone and/or a water vapor. The organic metal precursor may include a central metal atom, e.g., zirconium, hafnium or aluminum, and an organic ligand combined with the central metal atom. A purge process may be performed after forming each of the first dielectric layer 131, the second dielectric layer 133, and the third dielectric layer 135 to discharge an unreacted precursor and the reactive gas remaining in a process chamber.

Figure 3:
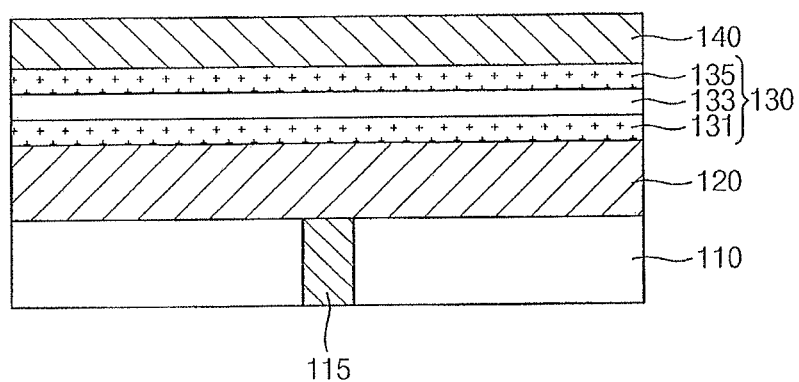

Referring to FIG. 3, a first upper electrode 140 may be formed, e.g., directly, on the dielectric layer 130 (e.g., on the third dielectric layer 135).

In example embodiments, the first upper electrode 140 may be formed of a metal, e.g., copper, aluminum, tungsten, platinum, rubidium, iridium, titanium, tantalum, etc., or a metal nitride, e.g., titanium nitride, tantalum nitride, tungsten nitride, etc. In some embodiments, the first upper electrode 140 may include titanium nitride or tantalum nitride, and may be formed by a process substantially the same as or similar to that for the formation of the lower electrode 120.

Figure 4:
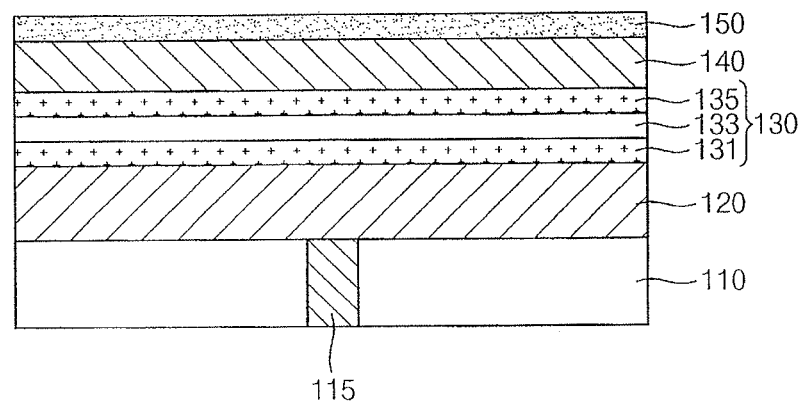

Referring to FIG. 4, a diffusion barrier 150 may be formed, e.g., directly, on the first upper electrode 140.

In example embodiments, the diffusion barrier 150 may be formed by oxidizing at least a portion of a top surface of the first upper electrode 140. In some embodiments, the oxidizing process may include a thermal treatment, e.g., a rapid thermal annealing (RTA) process.

In some embodiments, the diffusion barrier 150 may be formed by providing an oxidizing gas, e.g., oxygen ($O_2$), nitrous oxide ($N_2O$), water ($H_2O$), or the like, on a top surface of the first upper electrode 140. In example embodiments, the diffusion barrier 150 may be formed by a combination of the thermal treatment and the introduction of the oxidizing gas.

In some embodiments, a strong oxidizing agent, e.g., ozone ($O_3$), may be excluded from the oxidizing gas. If the strong oxidizing agent is used, the first upper electrode 140 may be excessively damaged. In some embodiments, a temperature of the thermal treatment may be controlled to be less than about 500° C. for preventing the damage of the first upper electrode 140. In an embodiment, the temperature of the thermal treatment may be controlled in a range from about 200° C. to about 500° C.

In an embodiment, the first upper electrode 140 and the diffusion barrier 150 may be formed in-situ, e.g., in the same deposition chamber. For example, the oxidizing gas may be introduced into the deposition chamber through a reactive gas flow path to form the diffusion barrier 150 on the first upper electrode 140.

In an embodiment, the diffusion barrier 150 may be formed in an independent thermal treatment apparatus after forming the first upper electrode 140.

Figure 5:
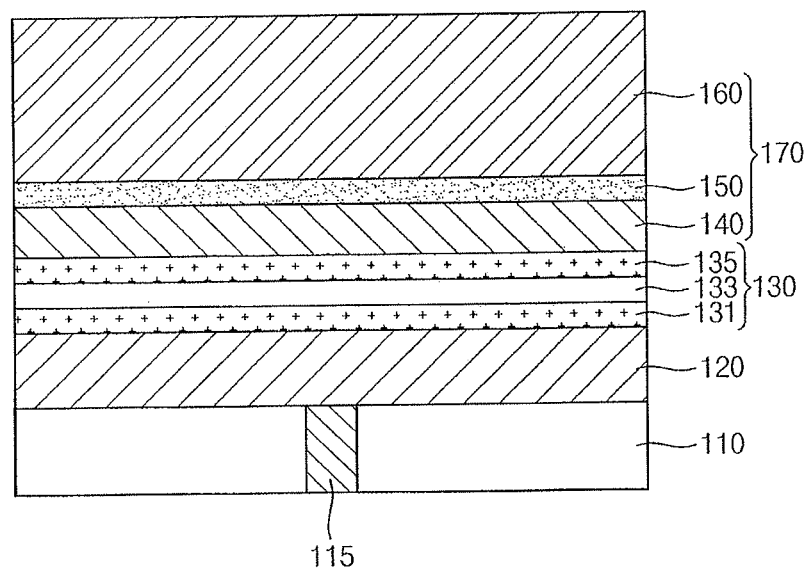

In an embodiment, the diffusion barrier 150 may be formed in a deposition chamber for forming a second upper electrode 160 (see FIG. 5). In this case, the diffusion barrier 150 and the second upper electrode 160 may be formed in-situ. For example, before forming the second upper electrode 160, the oxidizing gas may be introduced into the deposition chamber through a reactive gas flow path to form the diffusion barrier 150.

In an embodiment, the diffusion barrier 150 may be formed in a transfer carrier, e.g., a FOUP (front opening universal pod), before being transferred to the deposition chamber for forming the second upper electrode 160. For example, the transfer carrier may be opened to be exposed to an external atmosphere for a predetermined period, or the oxidizing gas may be introduced into the transfer carrier through a flow path so that the diffusion barrier 150 may be formed.

In example embodiments, the diffusion barrier 150 may have a property substantially the same as or similar to a conductive oxide. For example, the diffusion barrier 150 may include titanium oxide ($TiO_x$) and/or titanium oxynitride.

Referring to FIG. 5, the second upper electrode 160 may be formed, e.g., directly, on the diffusion barrier 150.

In example embodiments, the second upper electrode 160 may include a non-metallic conductive material. In some embodiments, the second upper electrode 160 may be formed of a silicon-based compound. For example, the second upper electrode 160 may be formed of doped polysilicon or amorphous silicon, or silicon-germanium (SiGe) optionally doped with impurities.

For example, if the second upper electrode 160 includes doped SiGe, the second upper electrode 160 may be formed by an ALD process or a CVD process utilizing, e.g., a silicon source gas, a germanium source gas and a dopant gas.

The silicon source gas may include, e.g., silane ($SiH_4$), dichlorosilane ($SiH_2Cl_2$), or the like. The germanium source gas may include, e.g., germane ($GeH_4$) or tetrachloro germanium ($GeCl_4$). The dopant gas may include, e.g., borane ($BH_3$), boron chloride ($BCl_3$), phosphine ($PH_3$), phosphorous chloride ($PCl_3$), or the like.

If an impurity, e.g., chlorine (Cl), were to penetrate through the first upper electrode 140 to be diffused into the dielectric layer 130 while performing a deposition process for forming the second upper electrode 160, a high-k property of the dielectric layer 130 could be degraded. For example, zirconium chloride or aluminum chloride could be created in the dielectric layer 130 to deteriorate a layer property of the dielectric layer 130. As described above, if the dielectric layer 130 includes a plurality of the high-k metal oxide layers, the diffusion of the impurity may become greater through interfaces between the metal oxide layers. As a result, a leakage current in the capacitor may be caused, and an operational failure, e.g., fail bits, may occur in the capacitor.

However, according to example embodiments, the diffusion barrier 150 is formed between the first upper electrode 140 and the second upper electrode 160 to block the diffusion of the impurity. Thus, the high-k property of the dielectric layer 130 may be maintained during subsequent processes, and electrical and mechanical reliability of the capacitor may be improved.

As illustrated in FIG. 5, the capacitor may include the lower electrode 120, the dielectric layer 130, and an upper electrode 170 sequentially stacked on the insulation layer 110 and the conductive pattern 115. The upper electrode 170 may include the first upper electrode 140, the diffusion barrier 150, and the second upper electrode 160 sequentially stacked on the dielectric layer 130. As described above, the first upper electrode 140 may include a metal or a metal nitride, and the second upper electrode 160 may include a conductive silicon-based compound.

In some example embodiments, the second upper electrode 160 may be thicker than the first upper electrode 140. For example, a thickness ratio of the second upper electrode 160 to the first upper electrode 140 may be from about 5 to about 100. If the thickness of the first upper electrode 140, e.g., including TiN, excessively increases, spikes may be generated at the first upper electrode 160 due to an irregular growth. Thus, the second upper electrode 160 may be formed to have a sufficient thickness to achieve an electrical property of the capacitor, and the second upper electrode 160 may be used as a pad or a buffer layer for forming an upper contact.

In some embodiments, a thickness of the diffusion barrier 150 may be in a range from about $1/5$ to about $1/100$ of the thickness of the first upper electrode 140. The diffusion barrier 150 may be formed as a thin layer so that a conductivity of the upper electrode 170 may not be affected adversely while blocking the diffusion of the impurity.

FIGS. 6 to 14 are cross-sectional views illustrating a semiconductor device and a method of manufacturing the semiconductor device in accordance with example embodiments. For example, FIGS. 6 to 14 illustrate a method of manufacturing a DRAM device including a capacitor.

Detailed descriptions of processes substantially the same as or similar to those illustrated with reference to FIGS. 1 to 5 are omitted herein.

Figure 6:
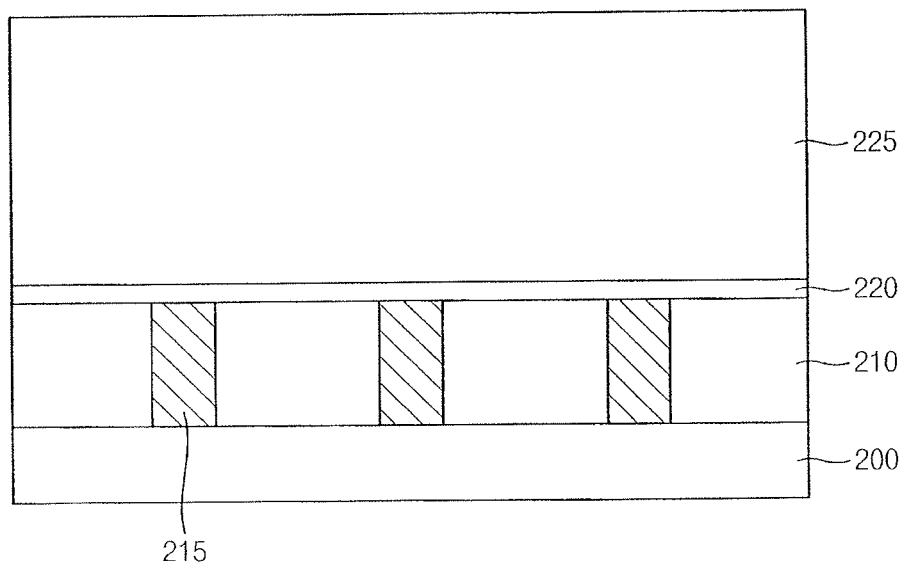
FIGS. 6 to 14 illustrate cross-sectional views of a semiconductor device and a method of manufacturing the semiconductor device in accordance with example embodiments.

Referring to FIG. 6, a lower insulation layer 210, a lower contact 215, an etch-stop layer 220, and a mold layer 225 may be formed on a substrate 200.

The substrate 200 may include, e.g., single crystalline silicon, single crystalline germanium, silicon-germanium or a group III-V compound such as GaP, GaAs, GaSb, etc. In some embodiments, the substrate 200 may be a silicon-on-insulator (SOI) substrate or a germanium-on-insulator (GOI) substrate. A device circuit including, e.g., a transistor, may be formed on the substrate 200.

The lower insulation layer 210 may be formed of a silicon oxide-based material, e.g., PEOX, TEOS, silicate glass, or the like, by a CVD process. The lower insulation layer 210 may be formed, e.g., directly, on the substrate 200 to cover the device circuit.

The lower insulation layer 210 may be partially etched to form a plurality of contact holes. A conductive layer filling the contact holes may be formed on the lower insulation layer 210. An upper portion of the conductive layer may be planarized by a chemical mechanical polish (CMP) process and/or an etch-back process to form the lower contact 215 in each contact hole.

The conductive layer may be formed of, e.g., a metal, doped polysilicon, a metal nitride and/or a metal silicide, by a CVD process, a physical vapor deposition (PVD) or an ALD process. The lower contact 215 may be electrically connected to the device circuit on the substrate 200.

The etch-stop layer 220 may be formed, e.g., directly, on the lower insulation layer 210 to cover the lower contacts 215. The etch-stop layer 220 may be formed of, e.g., silicon nitride or silicon oxynitride, by a CVD process or a plasma enhanced CVD (PECVD) process. In some embodiments, the formation of the etch-stop layer 220 may be omitted.

The mold layer 225 may be formed, e.g., directly, on the etch-stop layer 220. The mold layer 225 may be formed of a silicon oxide-based material by, e.g., a CVD process or a spin coating process.

Figure 7:
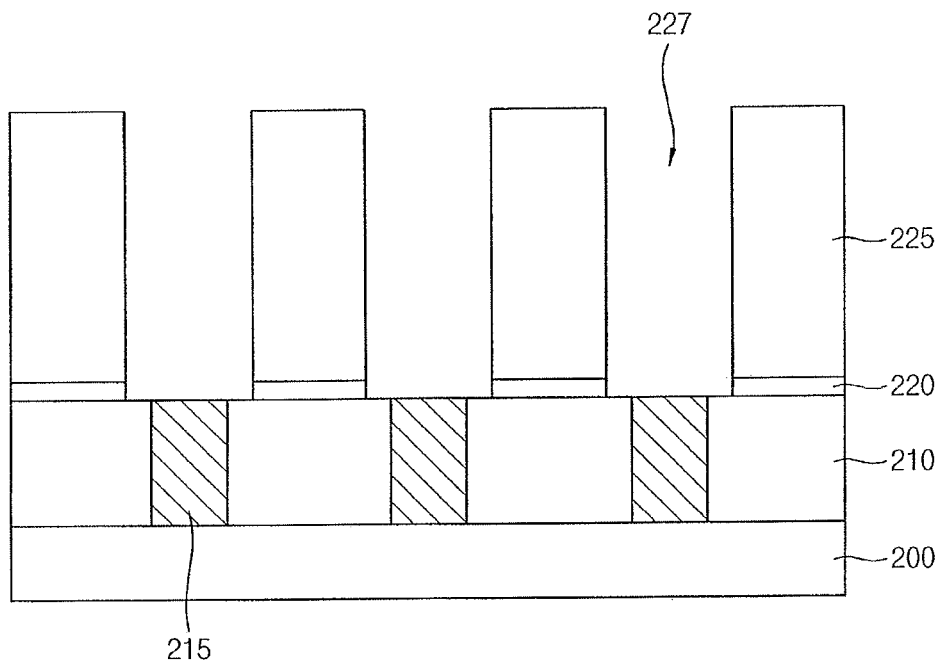

Referring to FIG. 7, the mold layer 225 and the etch-stop layer 220 may be partially removed to form an opening 227.

For example, a first etching process including a dry etching process or a wet etching process, in which hydrogen fluoride (HF) may be used, may be performed to partially remove the mold layer 225. A second etching process using an etchant gas including, e.g., $CH_3F$, $CHF_3$, $CF_4$, etc., may be performed to partially remove the etch-stop layer 220. Accordingly, a plurality of the openings 227 may be formed such that a top surface of each lower contact 215 may be exposed. While forming the openings 227, the lower insulation layer 210 may be protected by the etch-stop layer 220 from an etching damage.

A sidewall of the opening 227 may be substantially vertical, as illustrated in FIG. 7. However, embodiments are not limited thereto, e.g., the sidewall of the opening 227 may be substantially tapered with respect to a top surface of the lower insulation layer 210.

Figure 8:
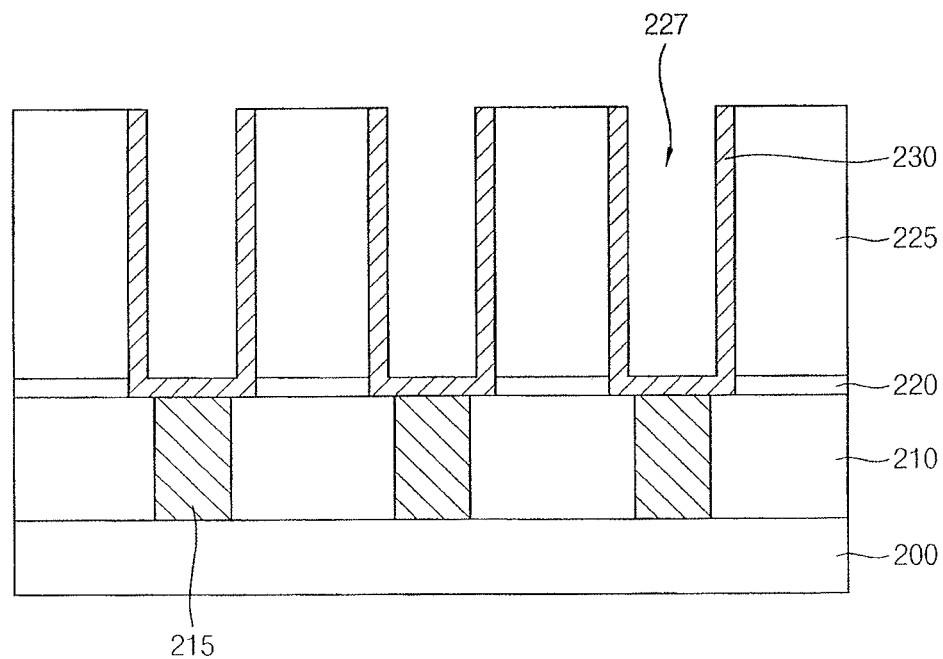

Referring to FIG. 8, a lower electrode 230 may be, e.g., conformally, formed, e.g., directly, on the sidewall and a bottom of the opening 227.

In example embodiments, a lower electrode layer may be formed along a top surface of the mold layer 225, and the sidewalls and the bottoms of the openings 227. A sacrificial layer may be formed on the lower electrode layer, and upper portions of the sacrificial layer and the lower electrode layer may be planarized by, e.g., a CMP process until the top surface of the mold layer 225 is exposed. Accordingly, the lower electrode 230 may be formed on an inner wall of each opening 227 from the lower electrode layer.

The lower electrode layer may be formed of a metal, e.g., copper, aluminum, tungsten, platinum, rubidium, iridium, titanium, tantalum, etc., or a metal nitride, e.g., titanium nitride, tantalum nitride, tungsten nitride, etc. In some embodiments, the lower electrode layer may be formed of titanium nitride.

The sacrificial layer may be formed of, e.g., silicon oxide, and may sufficiently fill the openings 227 on the lower electrode layer.

The lower electrode 230 may have a cup shape or a cylindrical shape a bottom of which is closed. The lower electrode 230 may serve as a storage electrode of a capacitor.

Figure 9:
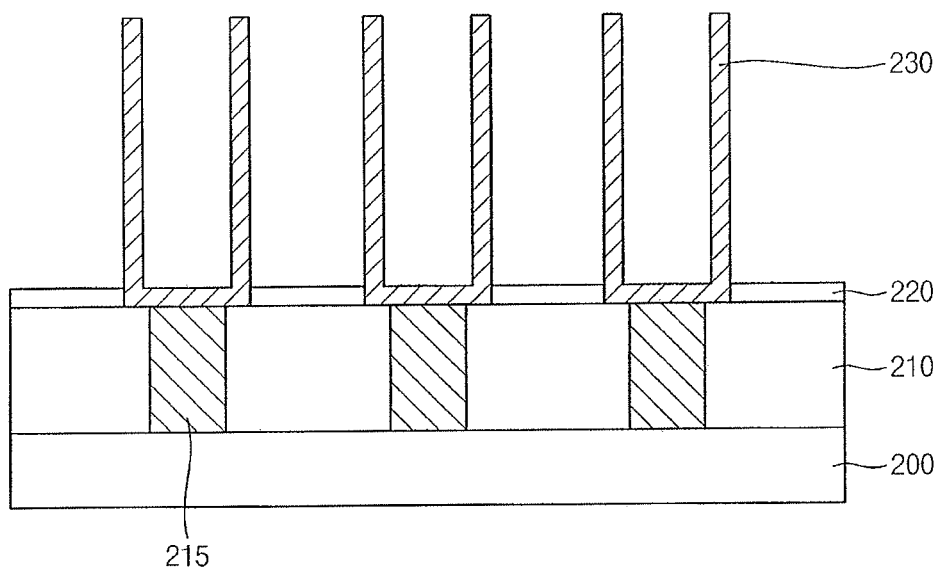

Referring to FIG. 9, the mold layer 225 may be removed. For example, the mold layer 225 may be removed by a wet etching process using, e.g., fluoric acid or ammonium fluoride. The sacrificial layer remaining on the lower electrode 230 may be removed together with the mold layer 225.

Figure 10:
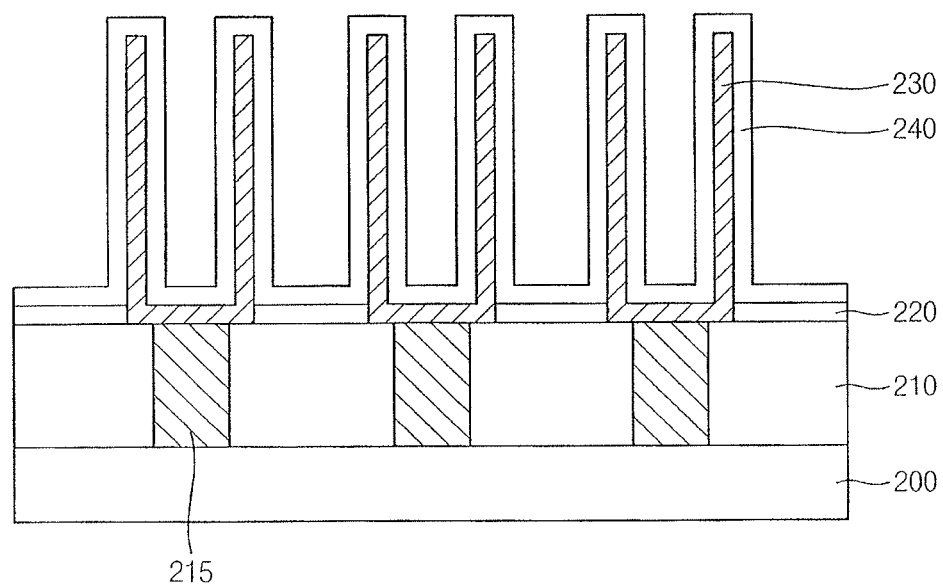

Referring to FIG. 10, a dielectric layer 240 may be formed on the lower electrode 230. For example, the dielectric layer 240 may be formed conformally along surfaces of the etch-stop layer 220 and the lower electrodes 230.

The dielectric layer 240 may be formed by a process substantially the same as or similar to that illustrated with reference to FIG. 2. In some embodiments, the dielectric layer 240 may be formed as a multi-layered structure including a high-k metal oxide. For example, the dielectric layer 240 may be formed as a triple-layered structure including a first dielectric layer (e.g., a zirconium oxide layer), a second dielectric layer (e.g., an aluminum oxide layer), and a third dielectric layer (e.g., a zirconium oxide layer), as discussed with reference to the dielectric layer 130 in FIG. 2.

Figure 11:
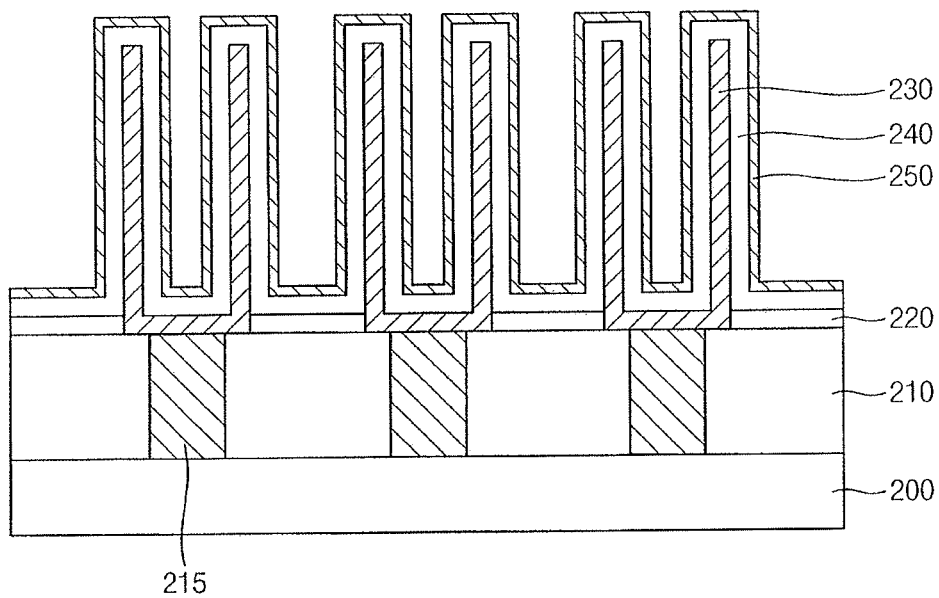

Referring to FIG. 11, a first upper electrode 250 may be formed on the dielectric layer 240.

The first upper electrode 250 may be formed by a process substantially the same as or similar to that described with reference to FIG. 3. For example, the first upper electrode 250 may be formed of a metal, e.g., copper, aluminum, tungsten, platinum, rubidium, iridium, titanium, tantalum, etc., or a metal nitride, e.g., titanium nitride, tantalum nitride, tungsten nitride, etc. In some embodiments, the first upper electrode 250 may be formed of titanium nitride.

As illustrated with reference to FIG. 11, the first upper electrode 250 may have a profile substantially the same as or similar to that of the dielectric layer 240. For example, the first upper electrode 250 may be, e.g., conformally, formed along the surfaces of the lower electrodes 230 and the etch-stop layer 220.

Figure 12:
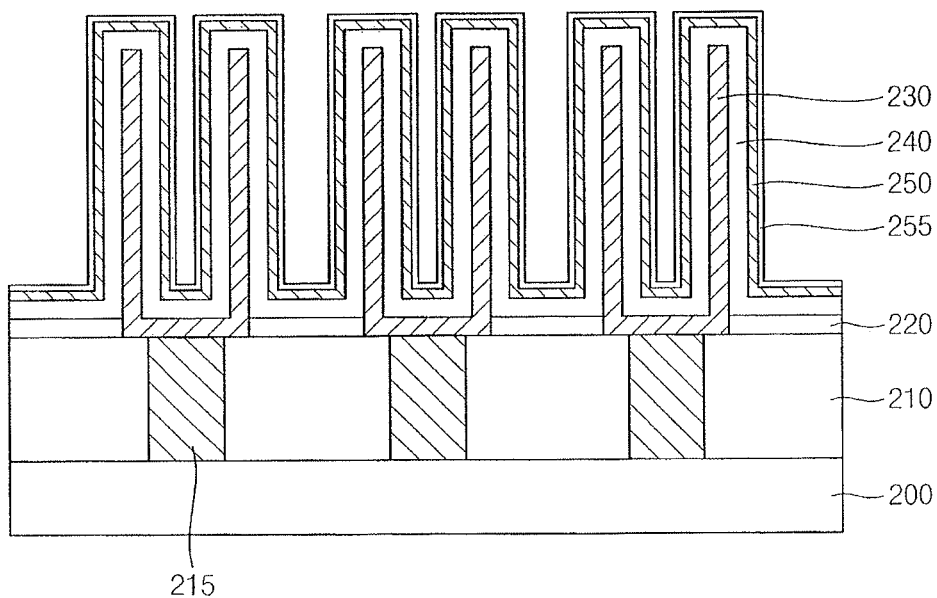

Referring to FIG. 12, a diffusion barrier 255 may be formed on the first upper electrode 250.

In example embodiments, the diffusion barrier 225 may be formed by a process substantially the same as or similar to that described with reference to FIG. 4. As described above, an oxidizing gas, e.g., $O_2$, $N_2O$, $H_2O$, or the like, may be introduced onto an upper surface of the first upper electrode 250 to form the diffusion barrier 255. In some embodiments, a thermal treatment, e.g., an RTA process, may be performed together with the introduction of the oxidizing gas to form the diffusion barrier 255. For example, the diffusion barrier 255 may be formed as a thin layer having a thickness in a range from about $1/5$ to about $1/100$ of a thickness of the first upper electrode 250.

Figure 13:
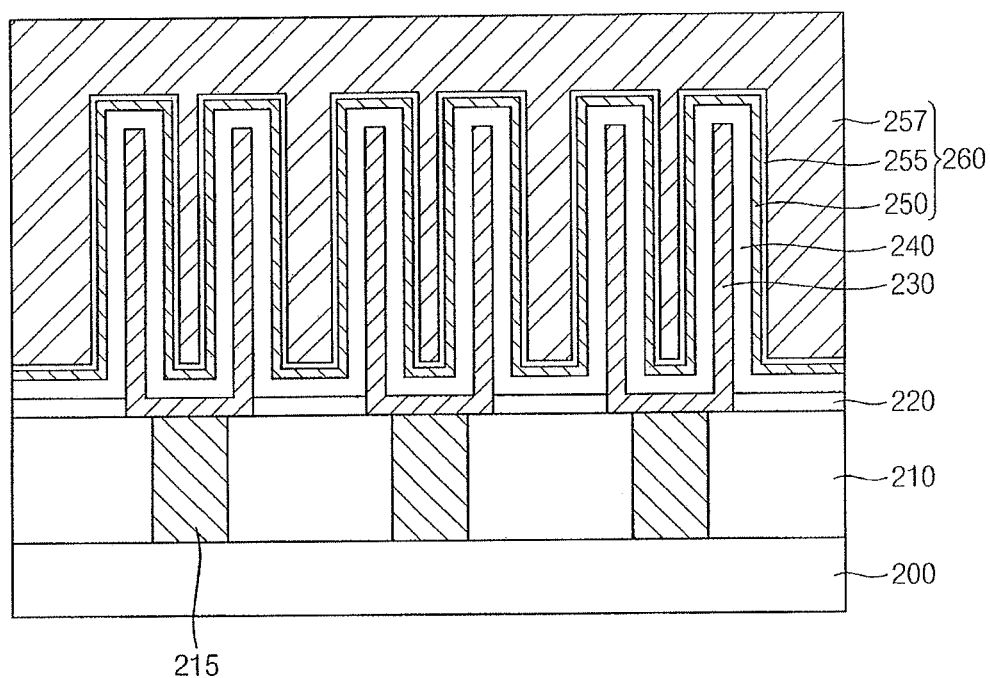

Referring to FIG. 13, a second upper electrode 257 may be formed on the diffusion barrier 255. Accordingly, an upper electrode 260 including the first upper electrode 250, the diffusion barrier 255, and the second upper electrode 257 may be formed. A capacitor including the lower electrode 230, the dielectric layer 240, and the upper electrode 260 may be defined.

The second upper electrode 257 may be formed by a process substantially the same as or similar to that illustrated with reference to FIG. 5. In example embodiments, the second upper electrode 257 may include polysilicon or amorphous silicon doped with impurities, and/or SiGe optionally doped with impurities.

While forming the second upper electrode 257, a diffusion of an impurity, e.g., chlorine, may be blocked by the diffusion barrier 255. Thus, damage or modification of the dielectric layer 240 due to the impurity may be prevented or reduced.

As illustrated in FIG. 13, the second upper electrode 257 may have a cap shape covering a plurality of the lower electrodes 230. For example, the upper electrode 260 may serve as a common plate electrode of the capacitor. A thickness ratio of the second upper electrode 257 to the first upper electrode 250 may be in a range from about 5 to about 100.

Figure 14:
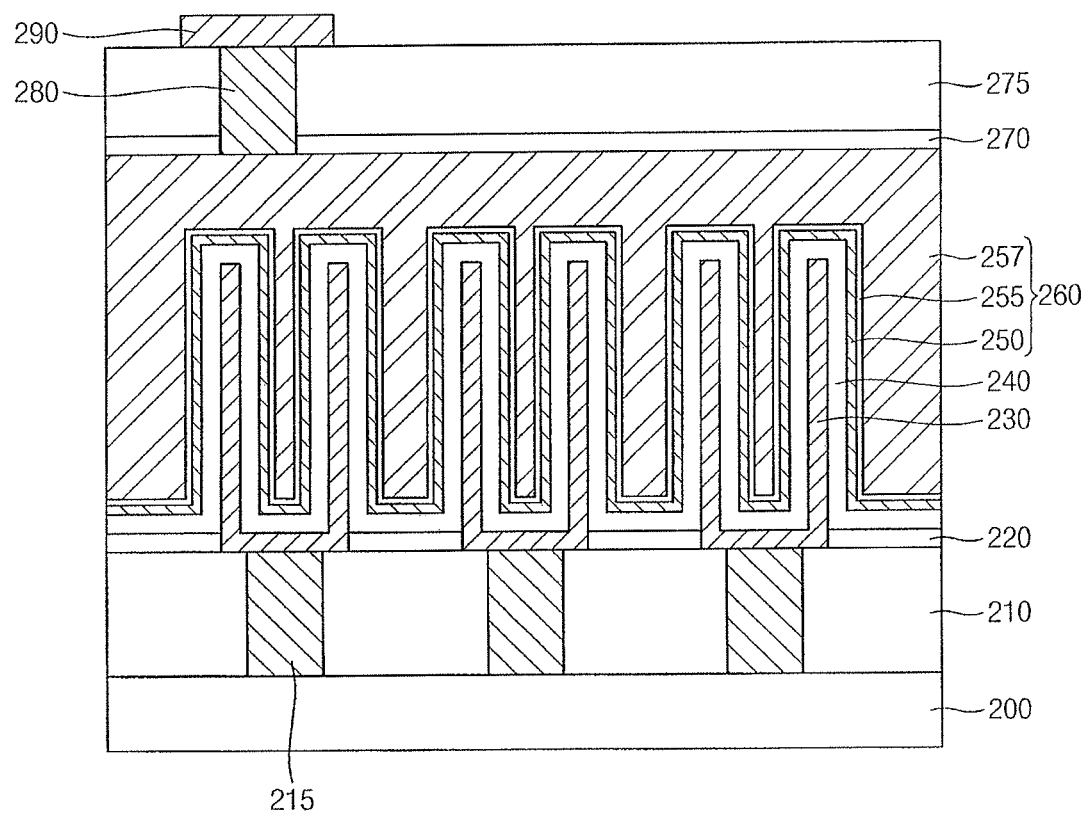

Referring to FIG. 14, a passivation layer 270 covering the upper electrode 260 may be formed. In example embodiments, the passivation layer 270 may be formed of silicon nitride by a PECVD process. A loss or a leakage of charges stored in the capacitor may be prevented or reduced by the passivation layer 270.

An upper insulation layer 275 may be formed on the passivation layer 270. The upper insulation layer 275 may be formed of a silicon oxide-based material substantially the same as or similar to that included in the lower insulation layer 210.

An upper contact 280 may be formed through the upper insulation layer 275 and the passivation layer 270 to be electrically connected to the second upper electrode 257. For example, the upper insulation layer 275 and the passivation layer 270 may be partially etched to form a contact hole through which the second upper electrode 257 may be exposed. The contact hole may be filled with a conductive material including a metal, doped polysilicon, a metal nitride and/or a metal silicide to form the upper contact 280.

In example embodiments, the lower contact 215 may be provided individually for each capacitor, and the upper contact 280 may be provided for a plurality of the capacitors. An upper wiring 290 may be further formed on the upper insulation layer 275 to be electrically connected to the upper contact 280.

If the upper electrode 260 serves as the common plate electrode for the plurality of the capacitors as described above, the diffusion barrier 255 may be also provided for the plurality of the capacitors. For example, the diffusion barrier 255 may be formed continuously on surfaces of the first upper electrode 250 and the dielectric layer 240. Thus, the diffusion of the impurity may be blocked throughout an entire region of the dielectric layer 240

FIGS. 15 to 20 are cross-sectional views illustrating a shape of an upper electrode and a process of forming the upper electrode in accordance with example embodiments.

Figure 15:
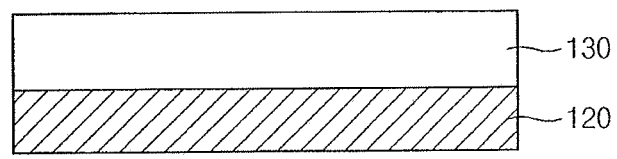
FIGS. 15 to 20 illustrate cross-sectional views of a shape of an upper electrode and a process of forming the upper electrode in accordance with example embodiments.

Referring to FIG. 15, as also illustrated with reference to FIGS. 1 and 2, the dielectric layer 130 may be formed on the lower electrode 120. In some embodiments, the dielectric layer 130, as illustrated in FIG. 2, may be formed as a multi-layered structure including the first dielectric layer 131, the second dielectric layer 133, and the third dielectric layer 135.

Figure 16:
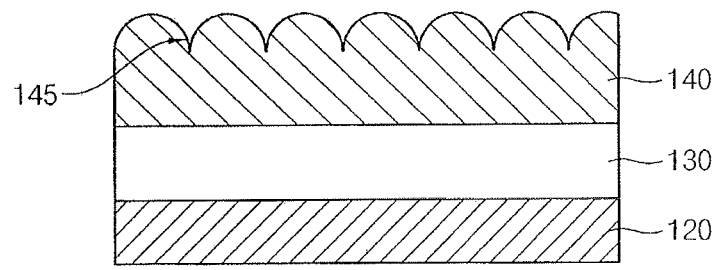

Referring to FIG. 16, as also illustrated with reference to FIG. 3, a first upper electrode 140a may be formed on the dielectric layer 130. The first upper electrode 140a may be formed of titanium nitride by an ALD process or a sputtering process. In this case, the first upper electrode 140a may include a plurality of pillars. A seam 145 may be generated between the pillars.

Figure 17:
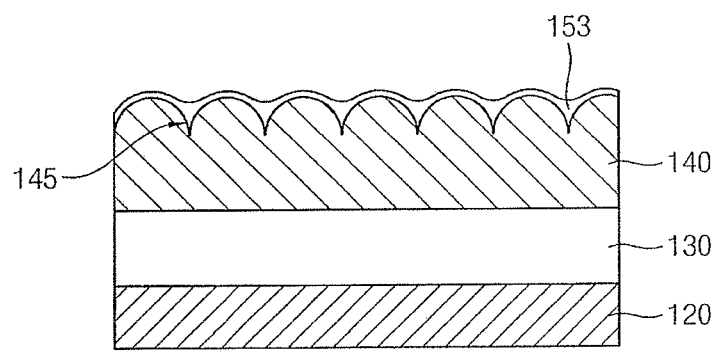
Figure 18:
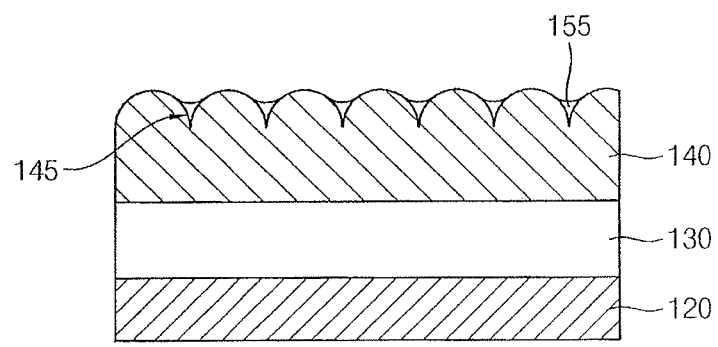

Referring to FIGS. 17 and 18, as also illustrated with reference to FIG. 4, a diffusion barrier may be formed on the first upper electrode 140a.

For example, as illustrated in FIG. 17, a diffusion barrier 153 may continuously and entirely cover an upper surface of the first upper electrode 140a, and may fill the seams 145. Thus, a diffusion of impurities through the seams 145 may be blocked while forming a second upper electrode 160a (see FIGS. 19 and 20).

In another example, as illustrated in FIG. 18, a diffusion barrier 155 may selectively fill or seal the seams 145 included in the first upper electrode 140a. In this case, the diffusion barrier 155 may have a discontinuous surface profile, and upper surfaces of the pillars may be exposed. An area or a region of the diffusion barrier 155 may be adjusted to selectively seal the seams 145, so that a conductive property of an upper electrode may be improved while preventing the diffusion of impurities to the dielectric layer 130.

Figure 19:
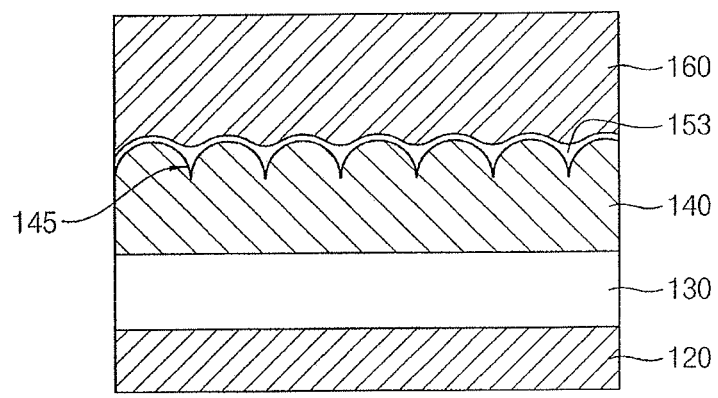
Figure 20:
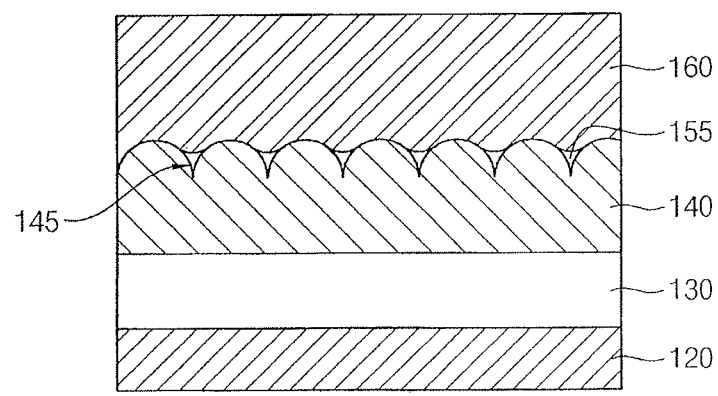

Referring to FIGS. 19 and 20, as also illustrated with reference to FIG. 5, the second upper electrode 160a may be formed on the diffusion barrier 153 and 155.

Figure 21:
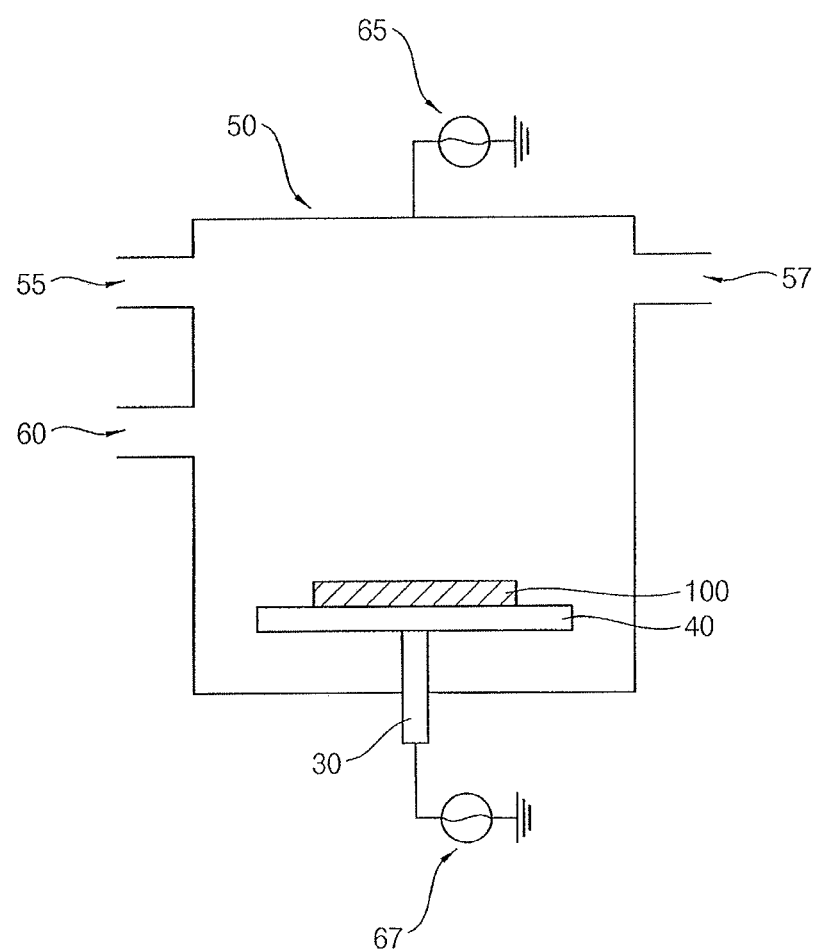
FIG. 21 illustrates a schematic view of a process chamber for forming an upper electrode in accordance with example embodiments.

FIG. 21 is a schematic view illustrating a process chamber for forming an upper electrode in accordance with example embodiments.

Referring to FIG. 21, a process chamber 50 may be a chamber for, e.g., a CVD process, an ALD process or a sputtering process. A supporter 40 for loading a substrate 100 may be placed at a lower portion of the process chamber 50. The supporter 40 may be rotatably connected to a chuck 30. A susceptor including a plurality of slots may be placed on the supporter 40, and the substrate 100 may be loaded on each slot.

In some embodiments, a first upper electrode (e.g., see FIG. 3) may be formed on the substrate 100, and a diffusion barrier may be formed in the process chamber 50 by an in-situ deposition process. For example, a first flow path 55 and a second flow path 57 may be coupled to the process chamber 50. A metal precursor (e.g., a titanium precursor) and a reactive gas for inducing a nitridation may be introduced through the first flow path 55 and the second flow path 57, respectively.

In some embodiments, a third flow path 60 may be further coupled to the process chamber 50. An oxidizing gas for forming the diffusion barrier may be introduced through the third flow path 60.

In some embodiments, the first upper electrode may be formed, and then the substrate 100 may be transferred to a different chamber (e.g., the process chamber 50) to form the diffusion barrier. For example, the oxidizing gas may be introduced through the third flow path 60 to form the diffusion barrier, and then a silicon source gas, a germanium source gas, and/or a dopant gas may be introduced through the first flow path 55 and/or the second flow path 57 to form a second upper electrode. In this case, the diffusion barrier and the second upper electrode may be formed by an in-situ deposition process.

A first power supply 65 may be connected to an upper portion of the process chamber 50 such that a high frequency power may be applied to an inside of the process chamber 50. In an embodiment, the first power supply 65 may be coupled to a metal target. In an embodiment, plasma may be generated in the process chamber 50 by the high frequency power.

In some embodiments, a second power supply 67 may be couple to the chuck 30. A high frequency power may be applied to the chuck 30 and/or the supporter 40 through the second power supply 67, and the oxidizing gas may be guided toward the substrate 100. Thus, the formation of the diffusion barrier may be facilitated.

In an embodiment, a heater may be combined to the supporter 40 to control a temperature of a heat treatment for the formation of the diffusion barrier.

Figure 22:
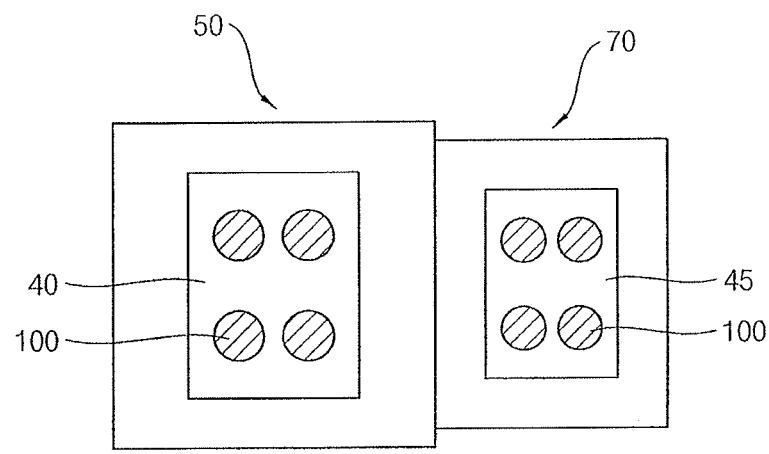
FIG. 22 illustrates a schematic view of a process chamber for forming an upper electrode in accordance with example embodiments.

FIG. 22 is a schematic view illustrating a process chamber for forming an upper electrode in accordance with example embodiments.

Referring to FIG. 22, the process chamber 50 may be connected or combined to a transfer chamber 70. In some embodiments, the process chamber 50 may have a construction substantially the same as or similar to that illustrated in FIG. 21. At least one carrier 45, e.g., a FOUP, may be disposed in the transfer chamber 70.

A plurality of the substrates 100 may be loaded on the supporter 40 in the process chamber 50, and a deposition process may be performed in the process chamber 50. For example, a deposition process for forming the second upper electrode (e.g., see FIG. 5) may be performed.

A plurality of the substrates 100 may be loaded on the carrier 45 in the transfer chamber 70, and may be introduced into the process chamber 50 for performing another deposition process.

In example embodiments, the diffusion barrier may be formed on the substrate 100 in the carrier 45, and then the substrate 100 may be introduced into the process chamber 50 to form the second upper electrode on the diffusion barrier.

In some embodiments, an oxidizing gas may be supplied into the carrier 45 through an individual flow path to form the diffusion barrier.

In some embodiments, the diffusion barrier may be formed by exposing the carrier 45 to an external atmosphere including oxygen. For example, the carrier 45 may be opened for a predetermined period, and thus the substrate 100 on which the first upper electrode is formed may be exposed to an oxidizing atmosphere. Accordingly, the diffusion barrier may be formed on the first upper electrode.

In some embodiments, the process chamber 50 may be a single-type chamber.

In some embodiments, the process chamber 50 may be a batch-type chamber. For example, a plurality of the carriers 45 in which the substrates 100 including the diffusion barriers are arranged may be loaded on the supporter 40 in the process chamber 50. In this case, the supporter 40 may be configured to load the plurality of the carriers 45 vertically.

Subsequently, the second upper electrodes may be formed concurrently on a plurality of the substrates 100 by a batch-type process in the process chamber 50.

FIGS. 23 to 37 are top plan views and cross-sectional views illustrating a semiconductor device and a method of manufacturing the semiconductor device in accordance with example embodiments. Specifically, FIGS. 23, 26 and 30 are top plan views illustrating stages of the method, and each of FIGS. 24, 25, 27 to 29, and 31 to 37 include sub-cross sectional views taken along lines I-I' and II-II' indicated in FIGS. 23, 26 and 30.

For example, FIGS. 23 to 37 illustrate a method of manufacturing a dynamic random-access memory (DRAM) device including a buried cell array transistor (BCAT) structure. Detailed descriptions on processes and/or materials substantially the same as or similar to those illustrated with reference to FIGS. 1 to 5, FIGS. 6 to 14, and/or FIGS. 15 to 20 are omitted herein. Two directions substantially parallel to a top surface of a substrate and perpendicular to each other are defined as a first direction and a second direction throughout FIGS. 23 to 37.

Figure 23:
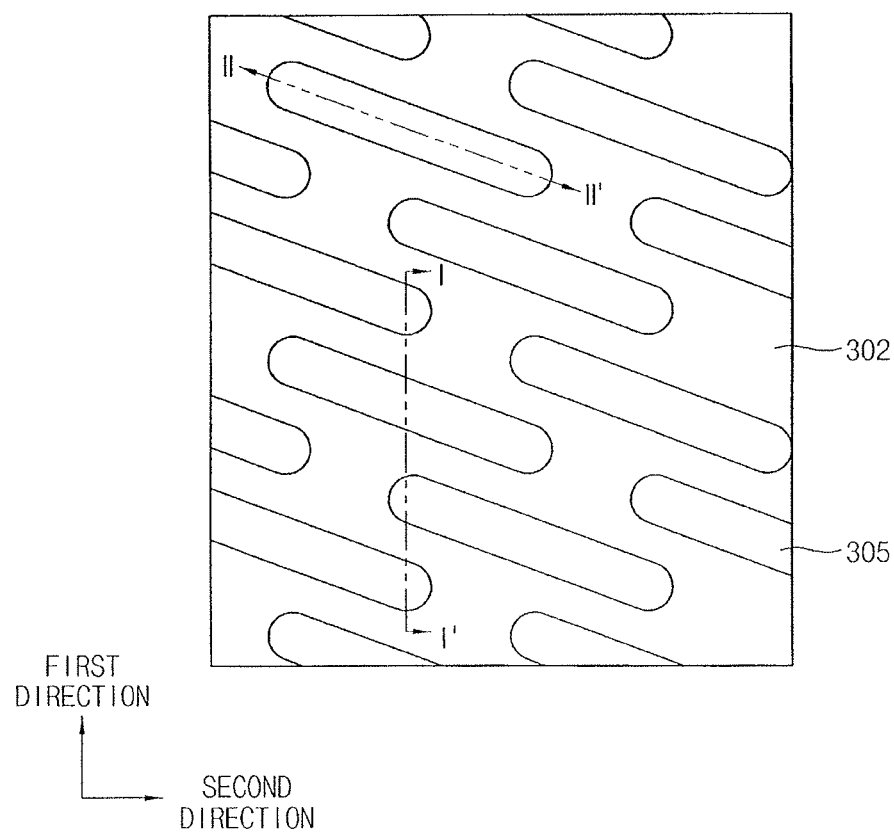
FIGS. 23 to 37 illustrate top plan views and cross-sectional views of a semiconductor device and a method of manufacturing the semiconductor device in accordance with example embodiments.
Figure 24:
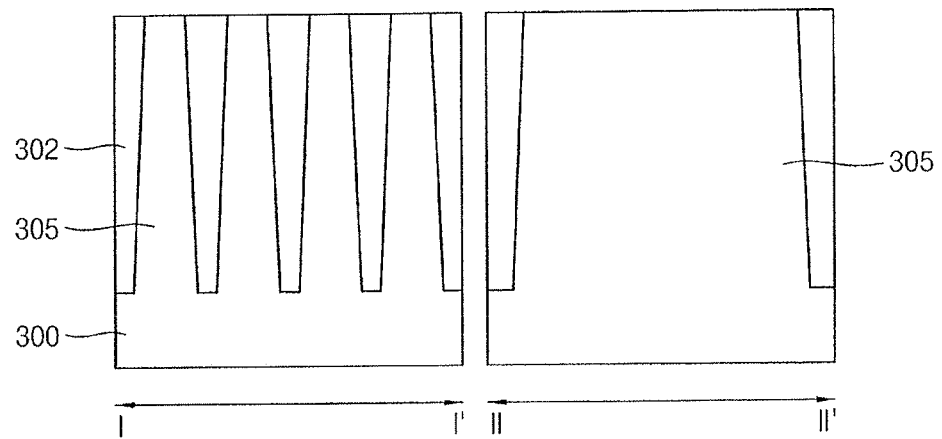

Referring to FIGS. 23 and 24, an isolation layer 302 may be formed on a substrate 300 to define active patterns 305.

The substrate 300 may include single crystalline silicon, single crystalline germanium, silicon-germanium or a group III-V compound such as GaP, GaAs, GaSb, etc. In some embodiments, the substrate 300 may be an SOI substrate or a GOI substrate.

For example, the isolation layer 302 and the active pattern 305 may be formed by a shallow trench isolation (STI) process. For example, an upper portion of the substrate 300 may be partially removed by an anisotropic etching process to form an isolation trench. An insulation layer filling the isolation trench and including, e.g., silicon oxide, may be formed on the substrate 300. An upper portion of the insulation layer may be planarized by, e.g., a CMP process, until a top surface of the substrate 300 may be exposed to form the isolation layer 302.

A plurality of the active patterns 305 may be formed to be spaced apart from each other by the isolation layer 302. As illustrated in FIG. 23, each active pattern 305 may extend in a diagonal direction to the first direction or the second direction by a predetermined angle. The plurality of the active patterns 305 may be arranged in the first and second directions.

Figure 25:
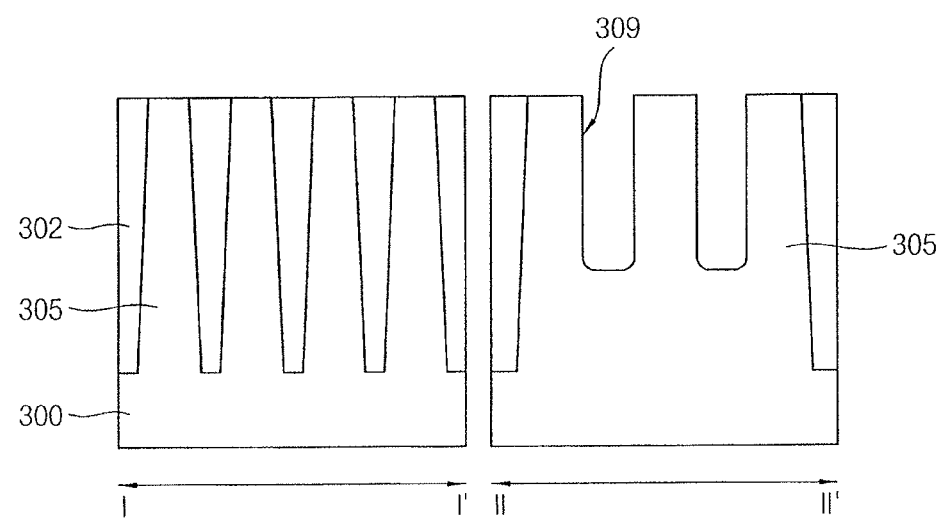
Figure 26:
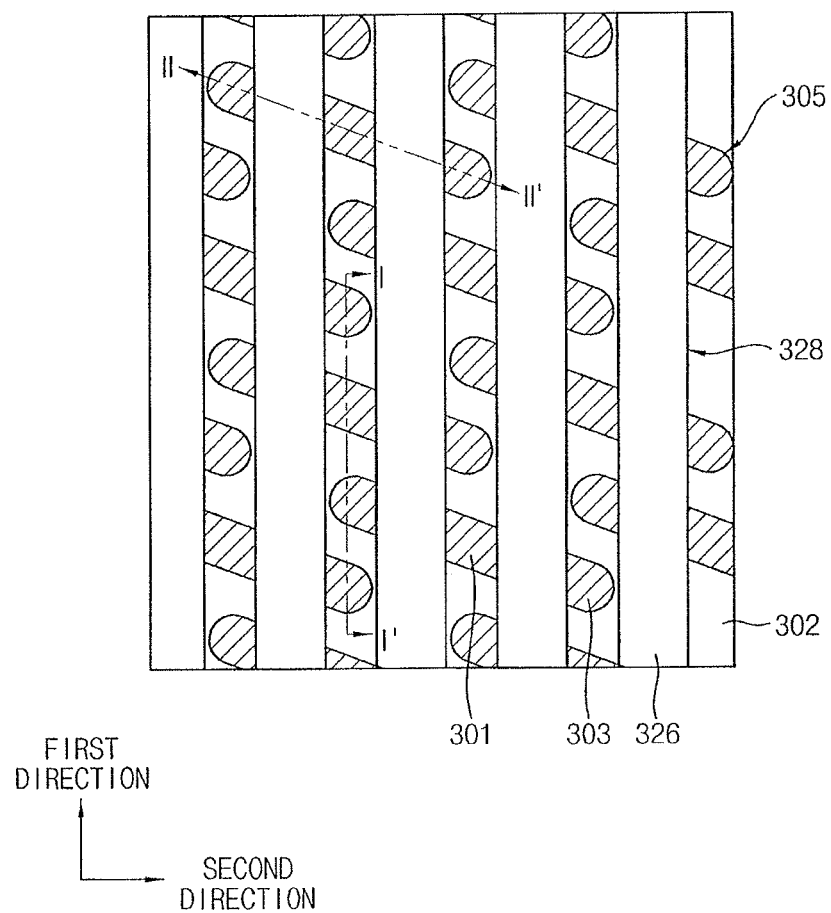

Referring to FIG. 25, upper portions of the active patterns 305 and the isolation layer 302 may be etched to form gate trenches 309.

In example embodiments, a hard mask partially exposing top surfaces of the active patterns 305 and the isolation layer 302 may be formed. The active patterns 305 and the isolation layer 302 may be partially etched using the hard mask to form the gate trenches 309.

For example, the gate trench 309 may extend in the first direction through the upper portions of the active patterns 305 and the isolation layer 302. A plurality of the gate trenches 309 may be formed along the second direction.

In some embodiments, two gate trenches 309 may be formed in one active pattern 305. In this case, an upper portion of one active pattern 305 may be divided into a central portion and two peripheral portions by the two gate trenches 309.

Figure 27:
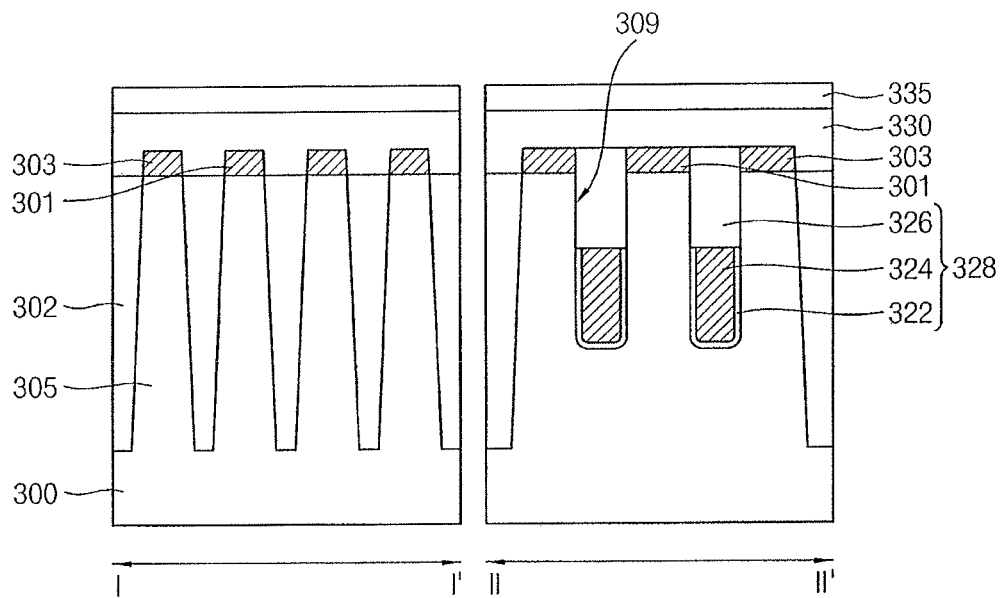

Referring to FIGS. 26 and 27, a gate structure 328 may be formed in the gate trench 309.

For example, a thermal oxidation process may be performed on surfaces of the active patterns 305 exposed by the gate trenches 309 to form a gate insulation layer. Alternatively, silicon oxide or a metal oxide may be deposited by, e.g., a CVD process on the surfaces of the active patterns 305 to form the gate insulation layer.

A gate conductive layer filling the gate trenches 309 may be formed on the gate insulation layer. The gate conductive layer and the gate insulation layer may be planarized by a CMP process until the top surface of the active pattern 305 may be exposed, and upper portions of the gate conductive layer and the gate insulation layer formed in the gate trench 309 may be partially removed by an etch-back process.

Thus, a gate insulation pattern 322 and a gate electrode 324 filling a lower portion of the gate trench 309 may be formed.

The gate conductive layer may be formed of, e.g., a metal and/or a metal nitride by an ALD process or a sputtering process.

A gate mask layer filling a remaining portion of the gate trench 309 may be formed on the gate insulation pattern 322 and the gate electrode 324. An upper portion of the gate mask layer may be planarized until the top surface of the active pattern 305 may be exposed to from a gate mask 326. The gate mask layer may be formed of, e.g., silicon nitride by a CVD process.

Accordingly, the gate structure 328 including the gate insulation pattern 322, the gate electrode 324 and the gate mask 326 sequentially stacked in the gate trench 309 may be formed.

According to the arrangement of the gate trenches 309 as described above, the gate structure 328 may extend in the first direction, and a plurality of the gate structures 328 may be formed along the second direction. The gate structure 328 may be buried in the active pattern 305. As described above, the upper portion of the active pattern 305 may be divided into the central portion between the gate structures 328, and the two peripheral portions facing the central portion with respect to the gate structure 328.

Subsequently, an ion-implantation process may be performed on the upper portion of the active patterns 305 to form a first impurity region 301 and a second impurity region 303. For example, the first impurity region 301 may be formed at the central portion of the active pattern 305 and the second impurity region 303 may be formed at the peripheral portion (e.g., at both ends) of the active pattern 305.

In some embodiments, as illustrated in FIG. 27, an upper portion of the isolation layer 302 may be partially removed by an etch-back process to expose the upper portion of the active pattern 305, and then the ion-implantation process may be performed to form the impurity regions 301 and 303.

A capping layer 330 covering the active patterns 305 and the isolation layer 302 may be formed, and a first insulating interlayer 335 may be formed on the capping layer 330. For example, the capping layer 330 and the first insulating interlayer 335 may be formed of silicon nitride and silicon oxide, respectively. The capping layer 330 may substantially serve as an etch-stop layer for protecting the active pattern 305 or the impurity regions 301 and 303 during subsequent etching processes. For convenience of descriptions, an illustration of the capping layer 330 and the first insulating interlayer 335 is omitted in FIG. 26.

Figure 28:
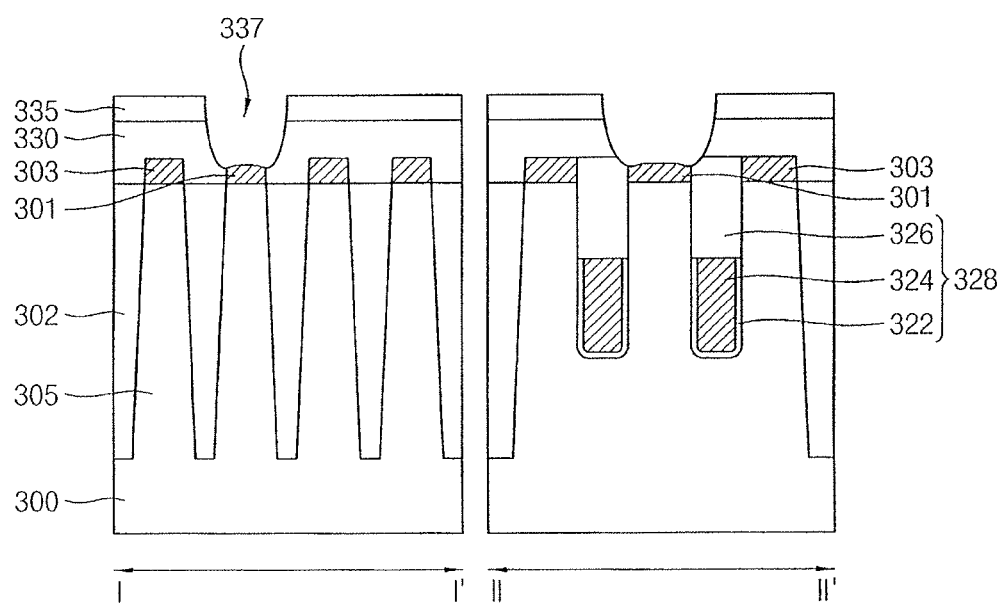

Referring to FIG. 28, the first insulating interlayer 335 and the capping layer 330 may be sequentially and partially etched to form a groove 337 through which the first impurity regions 301 may be exposed. The groove 337 may extend in the second direction, and a plurality of the grooves 337 may be formed along the first direction.

In some embodiments, the first impurity region 301 may be also partially removed by the etching process for forming the grove 337. Accordingly, a height difference between the first and second impurity regions 301 and 303 may be generated, and thus a bridge or a short circuit between a conductive line structure 355 (see FIG. 31) and a conductive contact 375 (see FIG. 34) formed by subsequent processes may be prevented.

Figure 29:
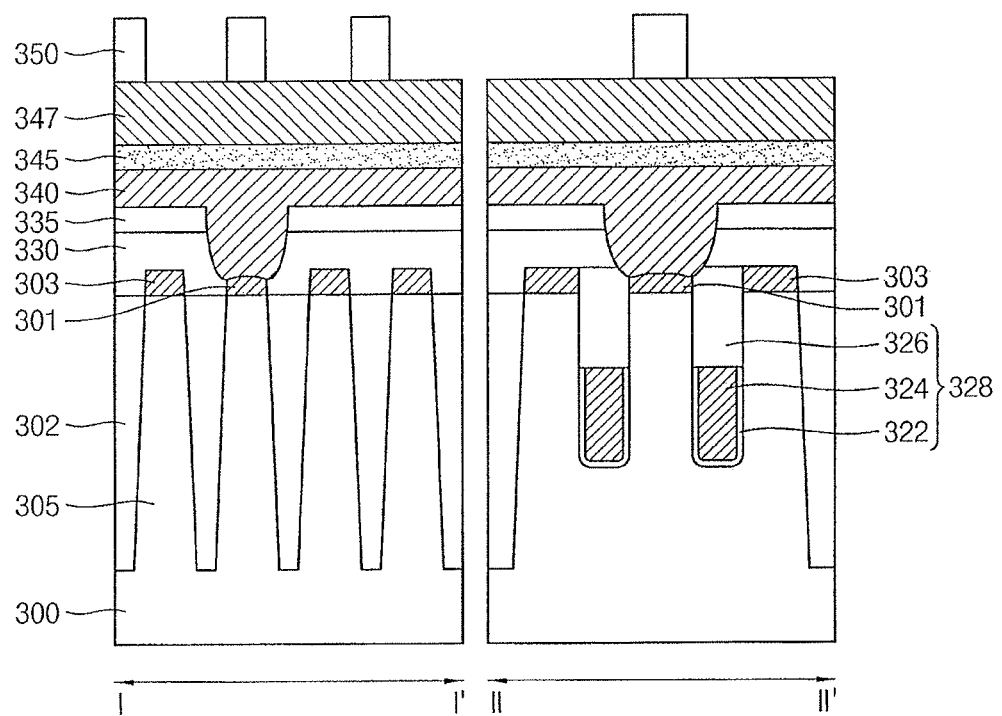
Figure 30:
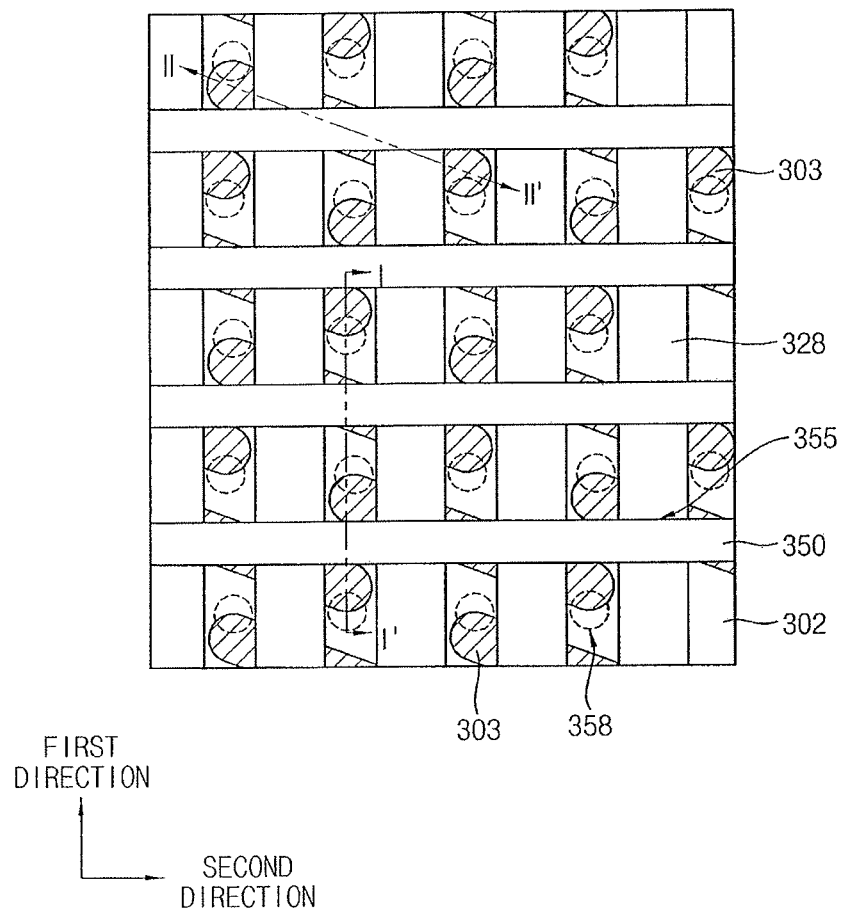

Referring to FIG. 29, a first conductive layer 340 filling the groove 337 may be formed on the first insulating interlayer 335. A barrier conductive layer 345 and a second conductive layer 347 may be sequentially formed on the first conductive layer 340, and a mask pattern 350 may be formed on the second conductive layer 347.

For example, the first conductive layer 340 may be formed using doped polysilicon, the barrier conductive layer 345 may be formed of a metal nitride or a metal silicide nitride, and the second conductive layer 347 may be formed using a metal. The first conductive layer 340, the barrier conductive layer 345 and the second conductive layer 347 may be formed by, e.g., a sputtering process, a PVD process or an ALD process.

The mask pattern 350 may include, e.g., silicon nitride, and may extend linearly in the second direction. A width of the mask pattern 350 (e.g., the width in the first direction) may be smaller than that of the groove 337.

Figure 31:
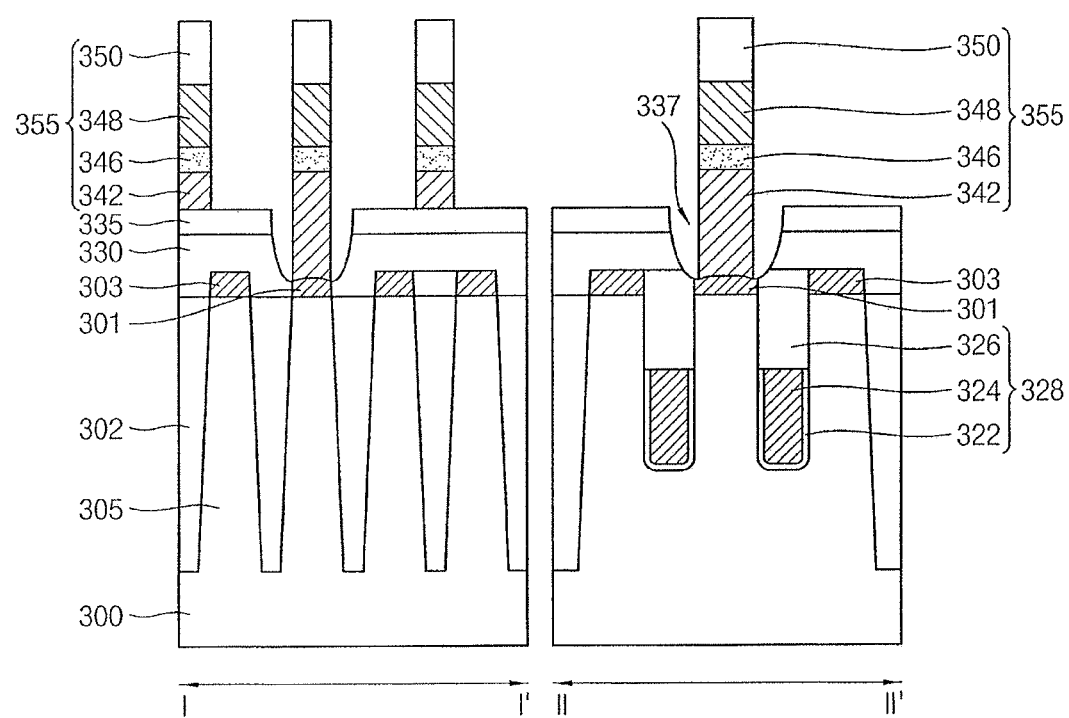

Referring to FIGS. 30 and 31, the second conductive layer 347, the barrier conductive layer 345 and the first conductive layer 340 may be sequentially etched using the mask pattern 350 as an etching mask. Accordingly, a first conductive pattern 342, a barrier conductive pattern 346 and a second conductive pattern 348 may be sequentially formed on the first impurity region 301. For convenience of descriptions, an illustration of the capping layer 330 and the first insulating interlayer 335 is omitted in FIG. 30.

Accordingly, the conductive line structure 355 extending in the second direction and including the first conductive pattern 342, the barrier conductive pattern 346, the second conductive pattern 348 and the mask pattern 350 may be formed on the first impurity region 301. In some embodiments, the conductive line structure 355 may serve as a bit line.

In some embodiments, the conductive line structure 355 may have a narrower width than that of the groove 337. Thus, a sidewall of the conductive line structure 355 may be spaced apart from a sidewall of the groove 337.

Figure 32:
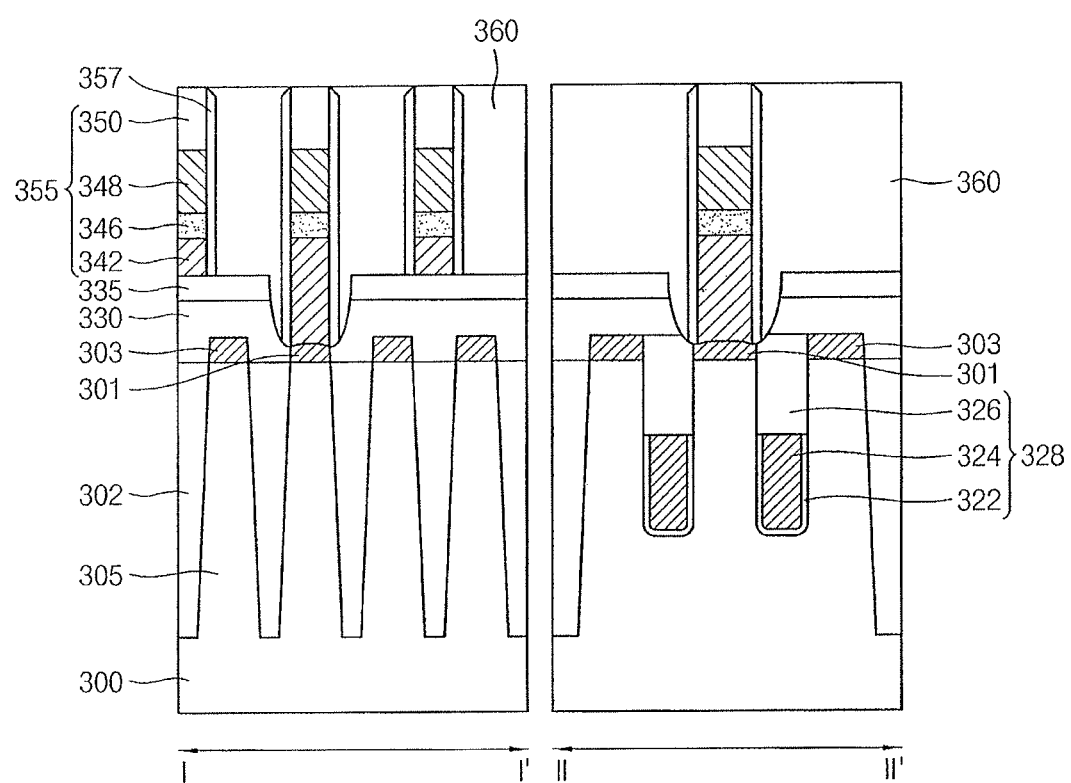

Referring to FIG. 32, a spacer 357 may be formed on the sidewall of the conductive line structure 355. For example, a spacer layer covering the conductive line structure 355 may be formed on the first insulating interlayer 335. The spacer layer may be anisotropically etched to form the spacer 357. The spacer layer may be formed of silicon nitride.

A second insulating interlayer 360 covering the conductive line structure 355 may be formed on the first insulating interlayer 335. The second insulating interlayer 360 may fill a remaining portion of the groove 337.

In some embodiments, an upper portion of the second insulating interlayer 360 may be planarized by a CMP process such that a top surface of the mask pattern 350 may be exposed. The second insulating interlayer 360 may be formed of silicon oxide substantially the same as or similar to that of the first insulating interlayer 335.

Figure 33:
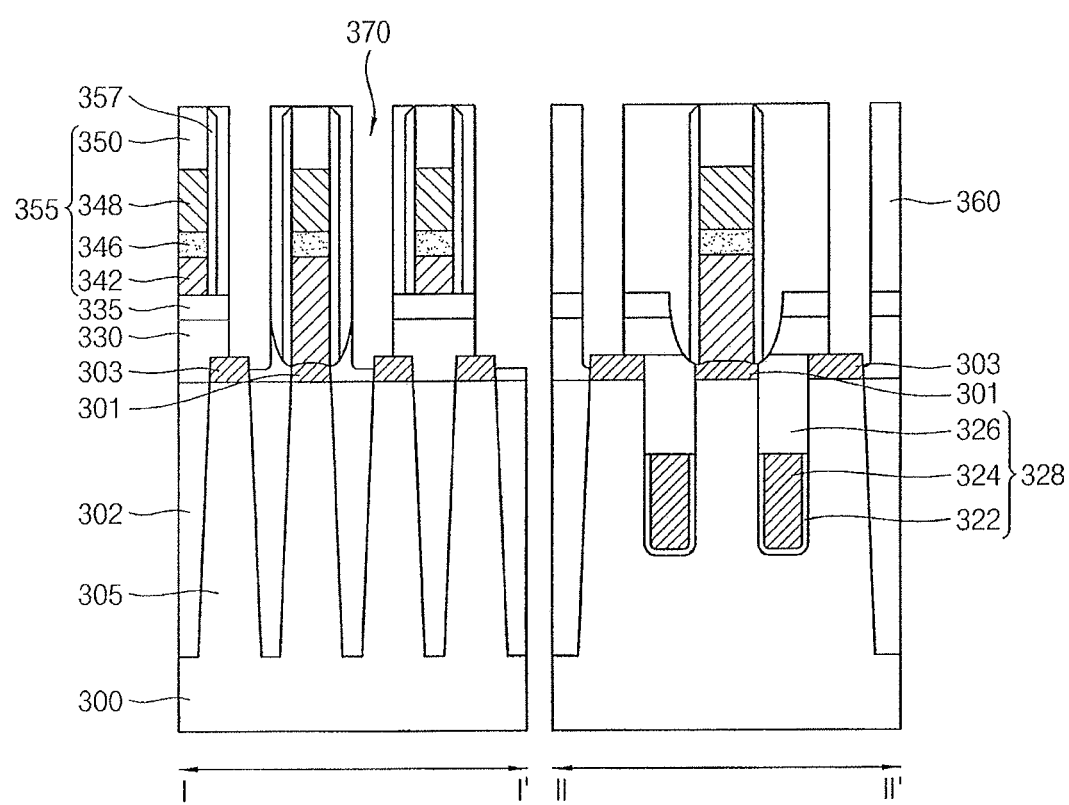

Referring to FIG. 33, the second insulating interlayer 360, the first insulating interlayer 335 and the capping layer 330 may be partially etched to form a contact hole 370 through which the second impurity region 303 may be exposed. The contact hole 370 may be formed per each hole formation area 358 indicated in FIG. 30.

In example embodiments, the contact hole 370 may be formed per each of the second impurity regions 303. Accordingly, two contact holes 370 may be formed on each of the active patterns 305. In some embodiments, the contact hole 370 may be self-aligned with the spacer 357. In this case, a sidewall of the spacer 357 may be also exposed by the contact hole 370.

As illustrated in FIG. 33, a top surface of the second impurity region 303 may be partially exposed through the contact hole 370. Thus, an insulating distance between the conductive contact 375 and the conductive line structure 355 may be increased, and a parasitic capacitance may be reduced.

Figure 34:
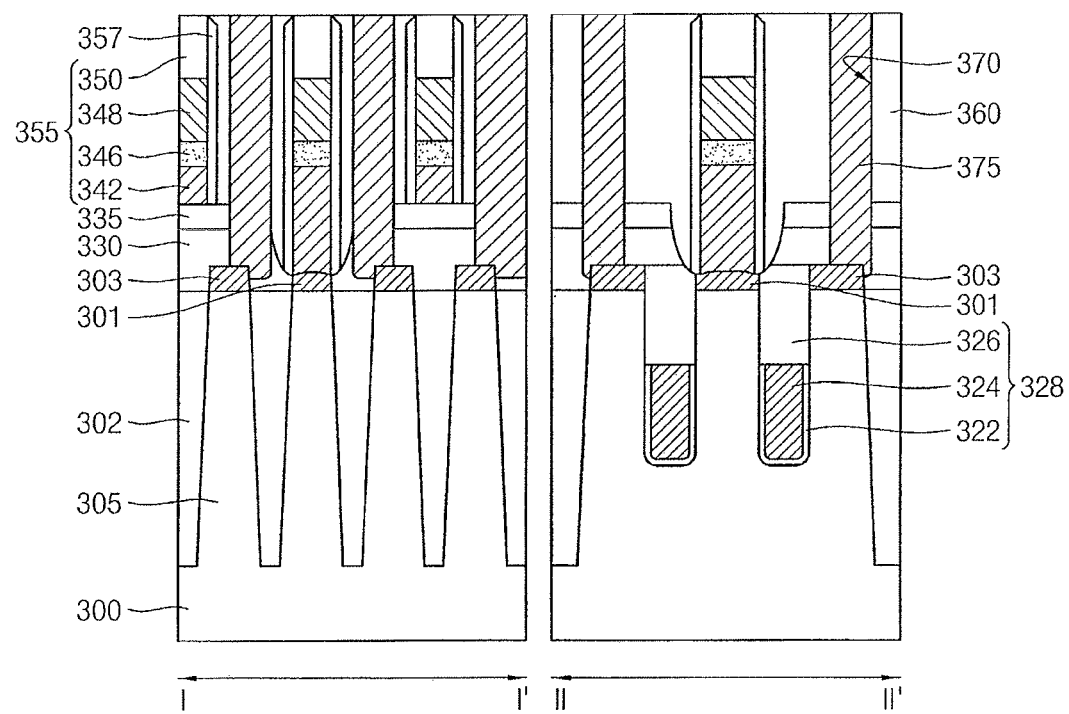

Referring to FIG. 34, the conductive contact 375 may be formed in the contact hole 370 to be electrically connected to or in contact with the second impurity region 303.

In example embodiments, a contact conductive layer filling the contact holes 370 may be formed on the second impurity region 303, the mask pattern 350 and the second insulating interlayer 360. An upper portion of the contact conductive layer may be planarized by a CMP process until the top surface of the mask pattern 350 is exposed to form the conductive contact 375 filling each contact hole 370

The contact conductive layer may be formed of a metal such as copper, tungsten, aluminum, etc., a metal nitride, doped polysilicon and/or a metal silicide by a sputtering process, a PVD process, an ALD process, a CVD process, etc. In some embodiments, the contact conductive layer may be formed by a plating process, e.g., a copper electroplating process. In an embodiment, a barrier conductive layer including, e.g., titanium or titanium nitride may be formed on an inner wall of the contact hole 370 before forming the contact conductive layer.

Figure 35:
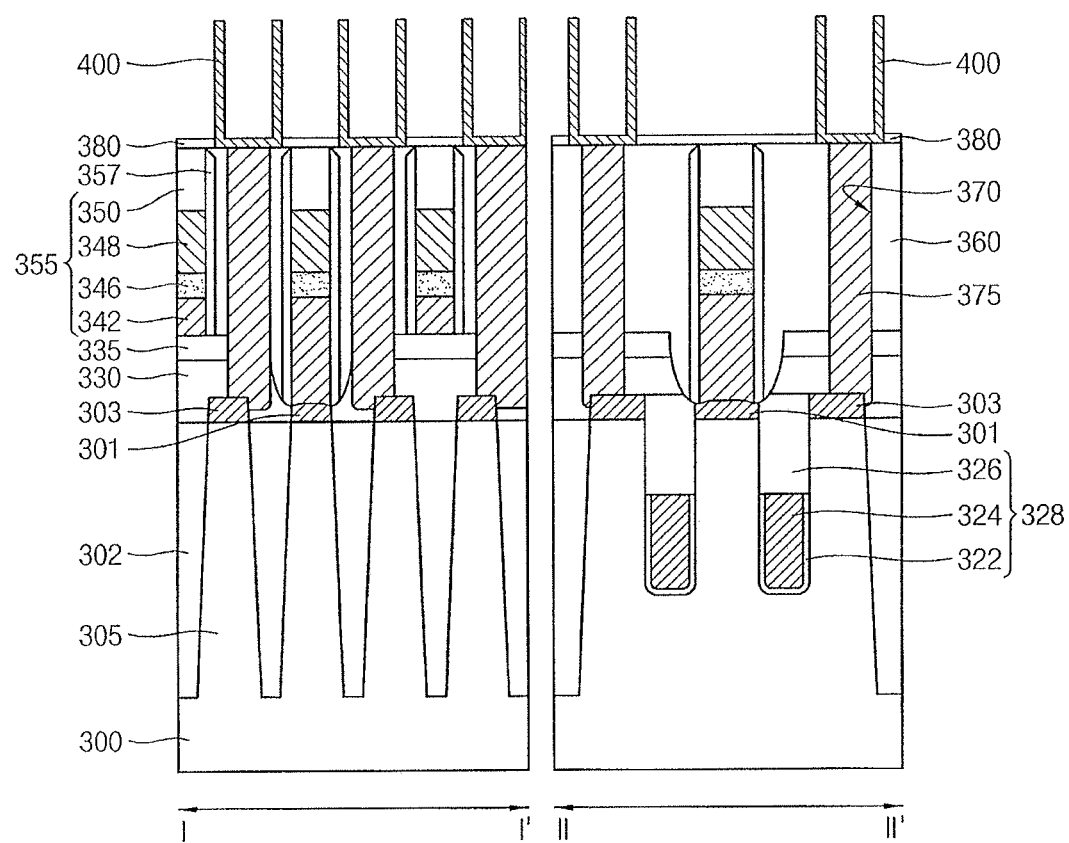

Referring to FIG. 35, a lower electrode 400 electrically connected to the conductive contact 375 may be formed on the second insulating interlayer 360.

For example, processes substantially the same as or similar to those illustrated with reference to FIGS. 6 to 9 may be performed to form an etch-stop layer 380 and the lower electrode 400 on the second insulating interlayer 360 and the conductive contact 375. In an embodiment, the lower electrode 400 may be formed of a metal nitride, e.g., titanium nitride.

Figure 36:
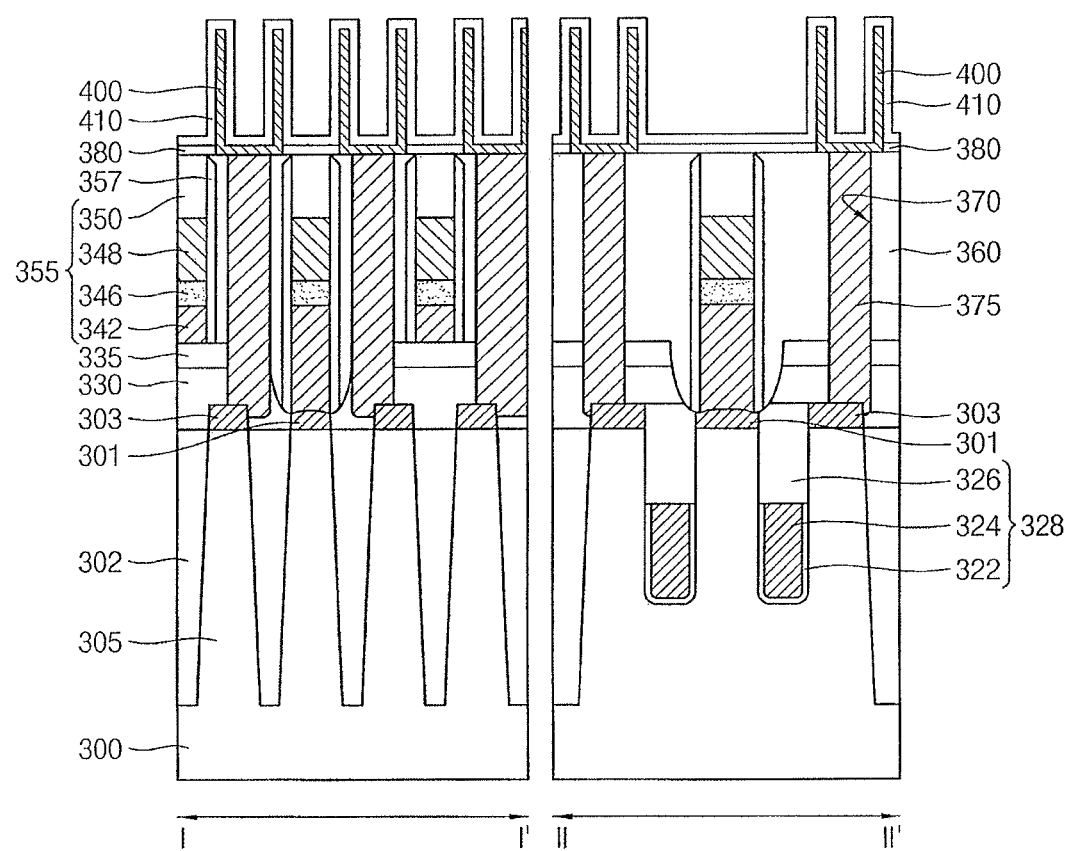

Referring to FIG. 36, for example, a dielectric layer 410 may be formed by a process substantially the same as or similar to that illustrated with reference to FIG. 2 or FIG. 10.

The dielectric layer 410 may be formed conformally along surfaces of the etch-stop layer 380 and the lower electrodes 400.

In some embodiments, the dielectric layer 410 may be formed as a multi-layered structure including a high-k metal oxide. For example, as illustrated in FIG. 2, the dielectric layer 410 may be formed as a triple-layered structure including a first dielectric layer (e.g., a zirconium oxide layer), a second dielectric layer (e.g., an aluminum oxide layer) and a third dielectric layer (e.g., a zirconium oxide layer).

Figure 37:
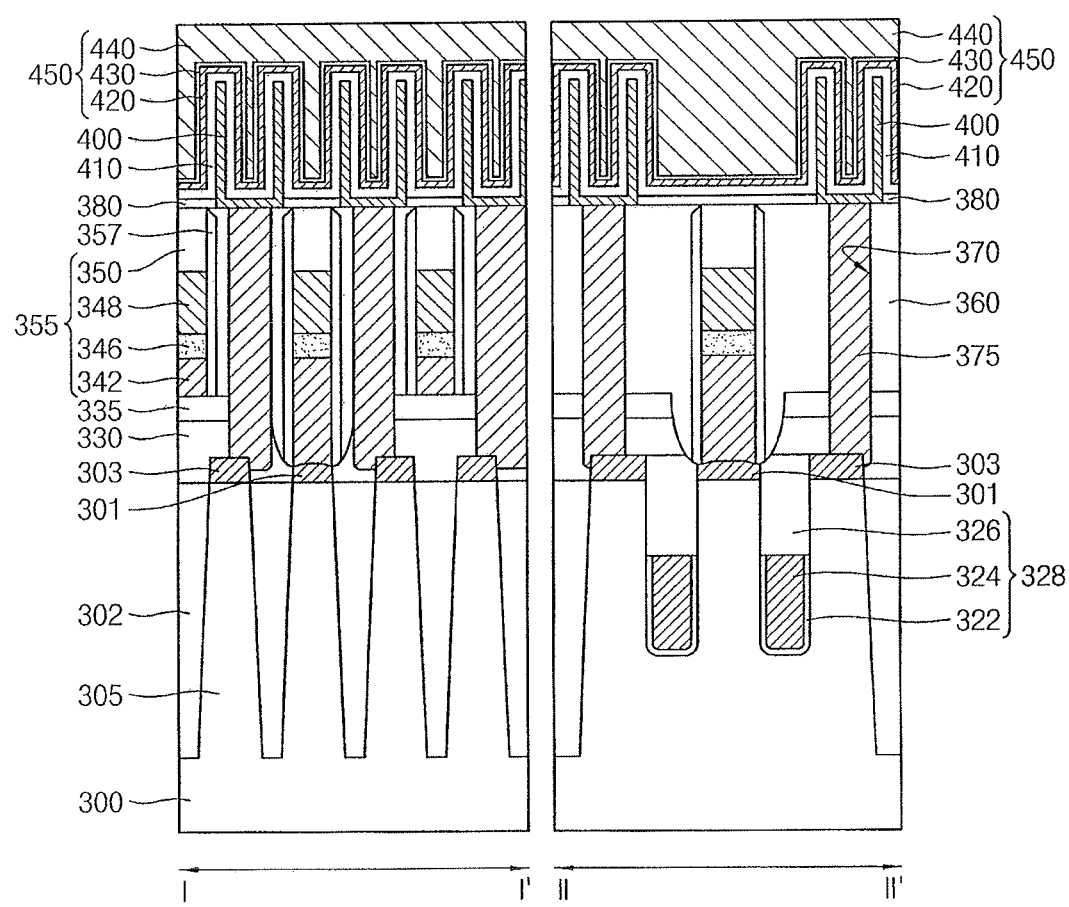

Referring to FIG. 37, processes substantially the same as or similar to those illustrated with reference to FIGS. 3 to 5, or FIGS. 11 to 13 may be performed. Accordingly, a first upper electrode 420, a diffusion barrier 430 and a second upper electrode 440 may be sequentially formed on the dielectric layer 410.

The first upper electrode 420 may have a profile substantially the same as or similar to that of the dielectric layer 410. In some embodiments, the first upper electrode 420 may be formed of a metal nitride such as titanium nitride.

The diffusion barrier 430 may be formed by an introduction of an oxidizing gas and/or a thermal treatment, and may substantially include a conductive oxide.

In some embodiments, as illustrated in FIG. 37 or FIG. 17, the diffusion barrier 430 may extend continuously on the first upper electrode 420.

In some embodiments, as illustrated in FIG. 18, the diffusion barrier 430 may be formed as a discontinuous pattern sealing seams formed at upper portions of the first upper electrode 420.

As described with reference to FIG. 21, the diffusion barrier 430 may be formed by providing the oxidizing gas through a flow path coupled to a process chamber. In some embodiments, the diffusion barrier 430 may be formed in-situ together with the first upper electrode 420 or the second upper electrode 440.

In some embodiments, the diffusion barrier 430 may be formed in an additional thermal treatment apparatus.

In some embodiments, as described with reference to FIG. 22, the diffusion barrier 430 may be formed in a transfer carrier such as a FOUP before the substrate 300 is loaded in a process chamber.

The second upper electrode 440 may have a cap shape covering a plurality of the lower electrodes 400, and may include a silicon-based compound, e.g., SiGe. A diffusion of an impurity such as chlorine may be blocked by the diffusion barrier 430 while forming the second upper electrode 440. Thus, electrical and mechanical reliability of the dielectric layer 410 may be maintained or improved.

An upper electrode 450 may be defined by the first upper electrode 420, the diffusion barrier 430 and the second upper electrode 440. A capacitor may be defined by the upper electrode 450, the dielectric layer 410 and the lower electrode 400. The upper electrode 450 may serve as a common plate electrode for a plurality of the capacitors.

Subsequently, as described with reference to FIG. 14, an upper contact electrically connected to the upper electrode 450 may be further formed.

According to processes as described above, the DRAM device illustrated in FIG. 37 may be fabricated. A high-k property of the dielectric layer 410 may be improved by the diffusion barrier 430, and thus leakage current and fail bits may be reduced in the DRAM device.

According to example embodiments, an upper electrode formed on a dielectric layer of a capacitor may include a first upper electrode formed of a metallic material, and a second upper electrode formed of a silicon-based compound. A diffusion barrier may be interposed between the first upper electrode and the second upper electrode, so a dopant gas used when forming the second upper electrode may be prevented from being diffused into the dielectric layer. For example, the first upper electrode may be formed of TiN, and the second upper electrode may be formed of Si or SiGe, so the diffusion barrier may include, e.g., $TiO_x$ or TiON, and may be formed by surface-treating the first upper electrode in an oxygen atmosphere. As such, the diffusion barrier may be formed substantially as a conductive oxide, and a dopant gas introduced while forming the second upper electrode may be prevented from penetrating through the diffusion barrier into the dielectric layer. Therefore, deterioration of dielectric properties of the capacitor may be avoided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a gate structure buried in a substrate, the gate structure including a gate insulation pattern, a gate electrode and a gate mask sequentially stacked, the gate insulation pattern covering a bottom and a sidewall of the gate electrode, and the gate mask being on top surfaces of the gate electrode and the gate insulation pattern;
first and second source/drain regions at upper portions, respectively, of the substrate adjacent to the gate structure;
a bit line on the first source/drain region;
a conductive contact on the second source/drain region; and
a capacitor electrically connected to the conductive contact, the capacitor including:
a lower electrode;
a dielectric layer on the lower electrode;
a first upper electrode on the dielectric layer, the first upper electrode including:
pillars having facing sidewalls in direct contact with each other, and
seams between tops of adjacent ones of the pillars;
a diffusion barrier on the first upper electrode, the diffusion barrier having a plurality of pieces spaced apart from each other, each of the plurality of pieces having a curved top surface and filling a respective one of the seams; and
a second upper electrode on the diffusion barrier.

2. The semiconductor device as claimed in claim 1, wherein each of the pillars of the first upper electrode has a rounded upper surface, the rounded upper surface facing the second upper electrode, and the seams of the first upper electrode being at contact points between rounded upper surfaces of adjacent ones of the pillars.

3. The semiconductor device as claimed in claim 2, wherein at least a portion of the rounded upper surface of each of the pillars is not covered by the diffusion barrier.

4. The semiconductor device as claimed in claim 1, wherein the diffusion barrier includes a conductive metal oxide or a conductive metal oxynitride.

5. The semiconductor device as claimed in claim 4, wherein the diffusion barrier includes titanium oxide or titanium oxynitride.

6. The semiconductor device as claimed in claim 1, wherein the first upper electrode includes a metal or a metal nitride, and the second upper electrode includes a silicon-based compound.

7. The semiconductor device as claimed in claim 6, wherein the second upper electrode includes at least one of doped polysilicon, doped amorphous silicon, silicon-germanium (SiGe), or doped SiGe.

8. The semiconductor device as claimed in claim 6, wherein the first upper electrode includes titanium nitride.

9. The semiconductor device as claimed in claim 1, wherein the dielectric layer includes a plurality of layers, and at least one layer of the plurality of layers includes a metal oxide.

10. The semiconductor device as claimed in claim 9, wherein the dielectric layer includes at least one of zirconium oxide, hafnium oxide, or aluminum oxide.

11. The semiconductor device as claimed in claim 10, wherein the dielectric layer has a triple-layered structure, and each layer of the triple-layered structure includes at least one of zirconium oxide, hafnium oxide, or aluminum oxide.

12. A semiconductor device, comprising:

a gate structure extending through a substrate;

first and second source/drain regions at upper portions, respectively, of the substrate adjacent to the gate structure;

a bit line on the first source/drain region, the bit line including a conductive pattern structure and a mask pattern sequentially stacked, the conductive pattern structure including a plurality of conductive patterns;

a conductive contact on the second source/drain region; and a capacitor electrically connected to the conductive contact, the capacitor including:
- a lower electrode;
- a dielectric layer on the lower electrode;
- a first upper electrode on the dielectric layer, the first upper electrode having a rounded upper surface;
- a diffusion barrier on the first upper electrode, the diffusion barrier discontinuously covering the rounded upper surface of the first upper electrode; and
- a second upper electrode on the diffusion barrier.

13. The semiconductor device as claimed in claim 12, wherein:

the first upper electrode includes:
- pillars having facing sidewalls in direct contact with each other, and
- seams between tops of adjacent ones of the pillars and defining the rounded upper surface of the first upper electrode, the diffusion barrier at least partially filling the seams, and a distance from an uppermost surface of the dielectric layer to an uppermost surface of the diffusion barrier in each of the seams is smaller than a distance from the uppermost surface of dielectric layer to an uppermost surface of each of the pillars, the first upper electrode extending above the diffusion barrier.

14. The semiconductor device as claimed in claim 13, wherein each of the pillars of the first upper electrode has a rounded surface.

15. The semiconductor device as claimed in claim 14, wherein at least a portion of the rounded surface of each of the pillars is not covered by the diffusion barrier.

16. The semiconductor device as claimed in claim 12, wherein the first upper electrode includes a metal or a metal nitride, the diffusion barrier includes a conductive metal oxide or a conductive metal oxynitride, and the second upper electrode includes doped or undoped silicon, or doped or undoped silicon-germanium (SiGe).

17. The semiconductor device as claimed in claim 12, wherein the conductive pattern structure includes a first conductive pattern, a barrier conductive pattern, and a second conductive pattern sequentially stacked.

18. A semiconductor device, comprising:

an active pattern on a substrate, a sidewall of the active pattern being at least partially covered by an isolation layer;

a gate structure extending through the active pattern and the isolation layer;

first and second impurity regions at upper portions, respectively, of the active pattern adjacent to the gate structure, sidewalls of the first and second impurity regions not being covered by the isolation layer;

a bit line electrically connected to the first impurity region;

a conductive contact electrically connected to the second impurity region; and a capacitor electrically connected to the conductive contact, the capacitor including:
- a lower electrode;
- a dielectric layer on the lower electrode;
- a first upper electrode on the dielectric layer, the first upper electrode including:
  - pillars having facing sidewalls in direct contact with each other, and
  - seams between tops of adjacent ones of the pillars;
- a diffusion barrier on the first upper electrode, the diffusion barrier having a plurality of pieces spaced apart from each other, each of the plurality of pieces having a curved top surface and filling a respective one of the seams; and
- a second upper electrode on the diffusion barrier.

19. The semiconductor device as claimed in claim 18, wherein:

each of the pillars of the first upper electrode has a rounded upper surface, the seams of the first upper electrode being between rounded upper surfaces of adjacent ones of the pillars, and at least a portion of the rounded upper surface of each of the pillars is not covered by the diffusion barrier, the second upper electrode being conformal on the first upper electrode and the diffusion barrier.

20. The semiconductor device as claimed in claim 18, wherein the first upper electrode includes a metal or a metal nitride, the diffusion barrier includes a conductive metal oxide or a conductive metal oxynitride, and the second upper electrode includes doped or undoped silicon, or doped or undoped silicon-germanium (SiGe).

* * * * *